United States Patent
Hong et al.

(10) Patent No.: US 9,076,962 B2
(45) Date of Patent: Jul. 7, 2015

(54) NONVOLATIVE MEMORY

(71) Applicant: GLOBALFOUNDRIES Singapore Pte. Ltd., Singapore (SG)

(72) Inventors: Yang Hong, Singapore (SG); Yong Wee Francis Poh, Singapore (SG); Tze Ho Simon Chan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/162,721

(22) Filed: Jan. 23, 2014

(65) Prior Publication Data

US 2014/0264244 A1    Sep. 18, 2014

Related U.S. Application Data

(60) Provisional application No. 61/786,609, filed on Mar. 15, 2013.

(51) Int. Cl.
*H01L 45/00*      (2006.01)
*H01L 27/24*      (2006.01)

(52) U.S. Cl.
CPC ........ *H01L 45/1226* (2013.01); *H01L 45/1691* (2013.01); *H01L 45/126* (2013.01); *H01L 27/2436* (2013.01); *H01L 45/1608* (2013.01)

(58) Field of Classification Search
None
See application file for complete search history.

(56) References Cited

U.S. PATENT DOCUMENTS

| | | | |
|---|---|---|---|
| 7,323,734 B2 | 1/2008 | Ha et al. | |
| 7,893,417 B2 | 2/2011 | Ha et al. | |
| 2007/0063180 A1* | 3/2007 | Asano et al. | 257/3 |
| 2010/0055829 A1* | 3/2010 | Im et al. | 438/102 |
| 2010/0144087 A1* | 6/2010 | Ha et al. | 438/102 |
| 2010/0320434 A1* | 12/2010 | Choi et al. | 257/3 |
| 2011/0147690 A1* | 6/2011 | Yang | 257/2 |
| 2013/0221308 A1* | 8/2013 | Toh et al. | 257/2 |

OTHER PUBLICATIONS

Sadegh M. Sadeghipour et al., Phase Change Random Access Memory, Thermal Analysis, IEEE, 2006, pp. 660-665.

* cited by examiner

*Primary Examiner* — Daniel Luke
(74) *Attorney, Agent, or Firm* — Horizon IP Pte. Ltd.

(57) ABSTRACT

A phase changeable memory cell is disclosed. In an embodiment of the invention, a phase changeable memory cell is formed with an ultra-small contact area to reduce the programming current. This contact area between heater electrode and phase changeable material is limited by the thickness of thin films rather than lithographic critical dimension in one dimension. As a result, the contact area is much less than the square of lithographic critical dimension for almost every technology node, which is helps in reducing current. To further reduce the current and improve the heating efficiency, heater electrode is horizontally put with its length being tunable so as to minimize the heat loss flowing through the heater to the terminal that connects to the front end switch device. In addition, above and below the heater layer, low-thermal-conductivity material (LTCM) is used to minimize heat dissipation. This results in reduced power consumption of the phase changeable memory cell with improved reliability.

20 Claims, 25 Drawing Sheets

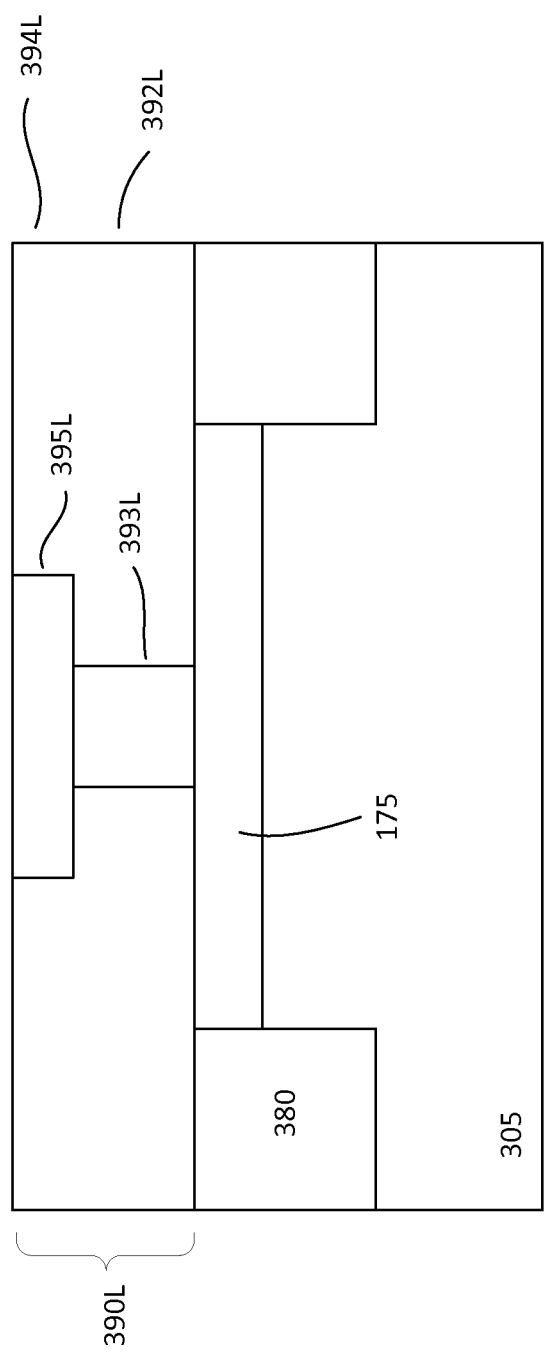

NONVOLATIVE MEMORY

CROSS-REFERENCE TO RELATED APPLICATION

This application claims the priority benefit of U.S. Provisional Application Ser. No. 61/786,609, filed on Mar. 15, 2013, which is herein incorporated by reference in its entirety.

BACKGROUND

Resistive-type non-volatile memories (NVMs), such as phase change random access memories (PCRAMs), employ memory elements having different stable resistive states. Such memory elements enable data corresponding to the different resistive states to be stored. The memory element switches from one resistive state to another. For PCRAMs, the switching between the states involves switching between an amorphous and a crystalline phase. The switching between two phases is achieved by heating the memory element using a heater.

However, conventional resistive NVMs have drawbacks. For example, conventional resistive NVMs, such as PCRAM, require large programming currents to switch from one resistive state to the other. To produce the necessary programming currents, a large transistor is needed. This results in a large cell size. Furthermore, the memory elements are disposed in close proximity with various heat sinks, for example metal lines as well as top and bottom electrodes, contributing to undesired heat loss and low heating efficiency. Inefficient heating and heat loss, as well as the proximity effect on the neighboring cells result in a decrease in reliability and performance and an increase in power consumption due to large programming current requirements.

Therefore, there is a need to improve resistive NVMs.

SUMMARY

Embodiments generally relate to semiconductor devices and method of forming semiconductor devices. In one embodiment, a method of forming a memory cell is disclosed. The method includes providing a substrate and forming a storage unit. The storage unit includes at least one cell stack having first and second opposing ends. A storage layer may be formed on the first end of the cell stack. A top electrode may further be formed on the first end of the cell stack. The top electrode is disposed over the storage layer. In addition, a bottom electrode may be formed on the second end of the cell stack.

In another embodiment, a memory cell is disclosed. The memory cell includes a storage unit disposed in an interlevel dielectric layer between first and second metal levels. The storage unit includes at least one cell stack having first and second opposing ends. A storage layer is disposed on the first end of the cell stack. The storage unit further includes a top electrode on the first end of the cell stack. The top electrode layer is disposed over the storage layer. The storage unit also includes a bottom electrode on the second end of the cell stack.

In yet another embodiment, a method of forming a memory cell is disclosed. The method includes providing a substrate and forming a storage unit. First and second cell stacks having a first and second opposing ends may be formed. The second ends of the cell stacks are adjacent to each other. A storage layer may be formed on the first ends of the cell stacks. A top electrode may further be formed on the first ends of the cell stacks. The top electrode is disposed over the storage layer. A bottom electrode may be formed on the second ends of the cell stacks.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the disclosure. In the following description, various embodiments of the present disclosure are described with reference to the following

FIGS. 5a-j show cross-sectional views of an exemplary process of forming a device.

DETAILED DESCRIPTION

Embodiments generally relate to semiconductor devices. More particularly, some embodiments relate to memory devices, such as non-volatile memory (NVM) devices. Such memory devices, for example, can be incorporated into standalone memory devices, such as USB or other types of portable storage units, or ICs, such as microcontrollers or system on chips (SoCs). The devices or ICs can be incorporated into or used with, for example, consumer electronic products, or relate to other types of devices.

Figure 1A:
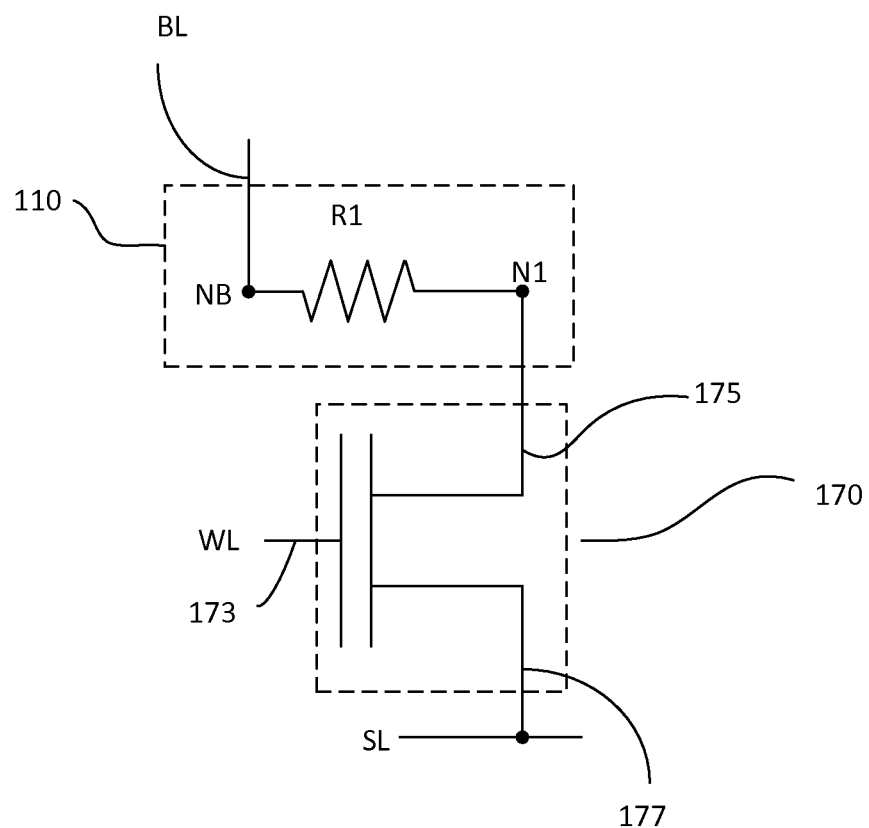
FIGS. 1a-b show schematic diagrams in accordance with embodiments of a device.

FIG. 1a shows a schematic diagram of an embodiment of a device. In one embodiment, the device includes a memory cell 100. The memory cell, in one embodiment, is a resistive-type memory cell. As shown, the memory cell includes a resistive element R1. Providing a memory cell with a plurality of resistive elements may also be useful. A resistive element is employed for storing information.

A resistive element is a programmable resistive element. The programmable resistive element has multiple stable resistive states. In one embodiment, the resistive element is a bi-stable resistive element having first and second stable resistive states. For example, the resistive element has a stable high resistive state and a stable low resistive state, with one corresponding to a logic "0" and the other corresponding to a logic "1". For example, the high resistive state may represent a logic 0 while the low resistive state may represent a logic 1. Having the high resistive state representing a logic 1 and the low resistive state representing a logic 0 may also be useful. Other configurations of data storage for the resistive element may also be useful. For example, the resistive element may have more than two stable resistive states. For example, the resistive element may have $2^n$ resistive states, where n is a whole number greater than 1. For example, the resistive element may have 4 resistive states (n=2), representing logics 00, 01, 10 and 11. Other number of resistive states may also be useful.

In one embodiment, a resistive element is a phase change (PC) resistive element to form a PCRAM. For example, the resistive element includes a PC material (PCM). The PCM, in one embodiment, is a chalcogenide material. In one embodiment, the chalcogenide material is a GeSbTe alloy. In another embodiment, the chalcogenide material may be $Ge_2Sb_2Te_5$ (GST). Other types of chalcogenide or PCMs may also be employed. Other types of thermal based elements forming other types of RAMs may also be useful.

The PC material has stable first and second phases. For example, the PCM can be in a first or a second phase, corresponding to a resistive state. For example, the first phase is a high resistive state and the second phase is a low resistive state. In one embodiment, the high resistive state is an amorphous phase and the low resistive state is a crystalline phase. One resistive state represents a logic "0" while the other resistive state represents a logic "1". For example, the high resistive state may represent a logic "0" while the low resistive state may represent a logic "1". Other configurations of PCMs may also be useful.

The PCM, in either phase or state, is stable until reset or set. The PCM, for example, is stable at below a threshold temperature. For example, the threshold temperature is about 85° C. Other threshold temperatures may also be useful and may depend on the type of PCM employed. The threshold temperature, for example, should be above normal operating temperature of the device. The retention of the PCM should be, for example, 10 years. The PCM may be reset to the amorphous phase from the crystalline phase by exposing it to a reset condition or set from the amorphous phase to the crystalline phase by exposing it to a set condition.

In one embodiment, the set condition includes heating the PCM at its amorphous phase to a crystallization temperature for a sufficient time to transform it to a crystalline phase. On the other hand, the reset condition includes heating to melt the crystalline PCM and rapidly cooling it so it becomes amorphous. Heating the PCM includes appropriately passing current to a heater or a heating element. The resistive element and heating element, for example, form a storage unit 110 of the memory cell.

The resistive element includes first and second resistive element terminals (RETS). In one embodiment, the first RET forms a first node N1 of the storage unit; the second RET forms a second node NB of the storage unit. The second node serves as a bitline node. A bitline BL is coupled to NB. As for N1, it is coupled to a cell selector 170. The cell selector, in one embodiment, is a transistor. As shown, the cell selector is a metal oxide semiconductor (MOS) transistor. The transistor, for example, may be a planar transistor. Other types of MOS transistors, such as fin-type MOS transistors may also be useful. Other types of transistors or cell selectors may also be useful. The transistor includes a gate and first and second transistor terminals 173, 175 and 177. The first transistor terminal is coupled to N1. As for the second transistor terminal, it is coupled to a select line SL while the gate terminal is coupled to a word line (WL).

Figure 1B:
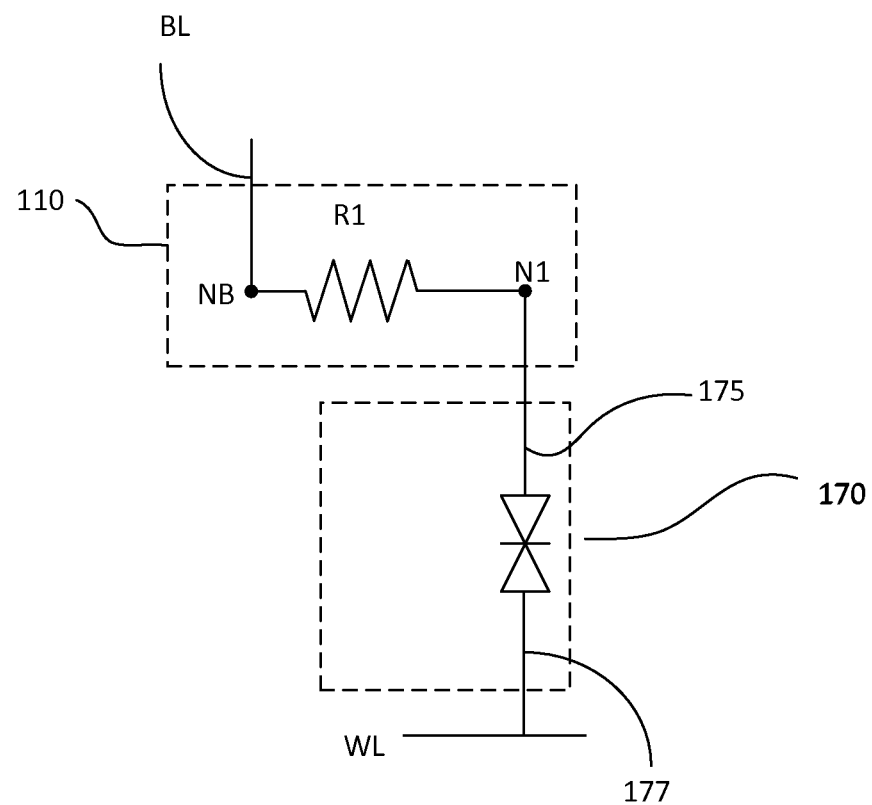

In other embodiments, the cell selector may be a bipolar junction transistor (BJT). For example, a first terminal of the BJT may be coupled to N1, a second terminal may be coupled to SL while a base of the BJT is coupled to WL. The first and second terminals are the collector and emitter terminals of the BJT. For example, in the case of a NPN BJT, the collector is coupled to the N1 and the emitter is coupled to SL. Other types of cell selectors may be employed. For example, in some cases, a diode may be used as a cell selector, as shown in FIG. 1b. In such cases, the diode is provided between N1 and WL, forming a cross-point type of memory cell. For example, a first terminal 175 of the diode is coupled to N1 while a second terminal 177 of the diode is coupled to WL. No SLs are employed for cell selectors which are diodes.

Although, as described, the resistive element is a PC resistive element, other types of resistive elements may also be useful. For example, the resistive element may be a thermal-based resistive element. The thermal-based resistive element may include a thermal assisted switching (TAS) magnetic material, forming a TAS magnetic RAM (TAS-MRAM). Other types of thermal based resistive elements, such as thermal chemical (TC) material, forming a TCRAM, may also be useful.

Figure 1C:
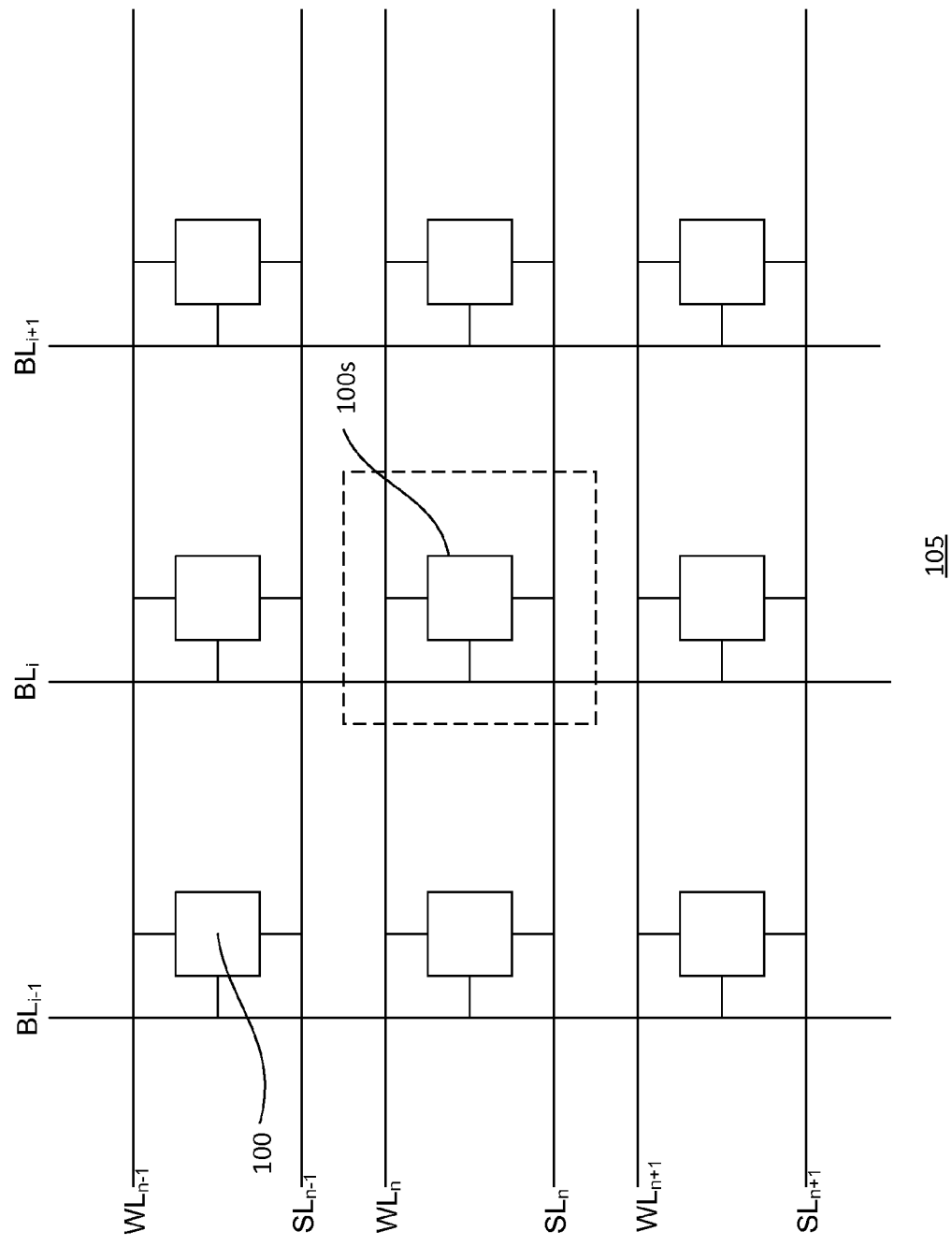
FIGS. 1c-d show portions of a memory cell array.
Figure 1D:
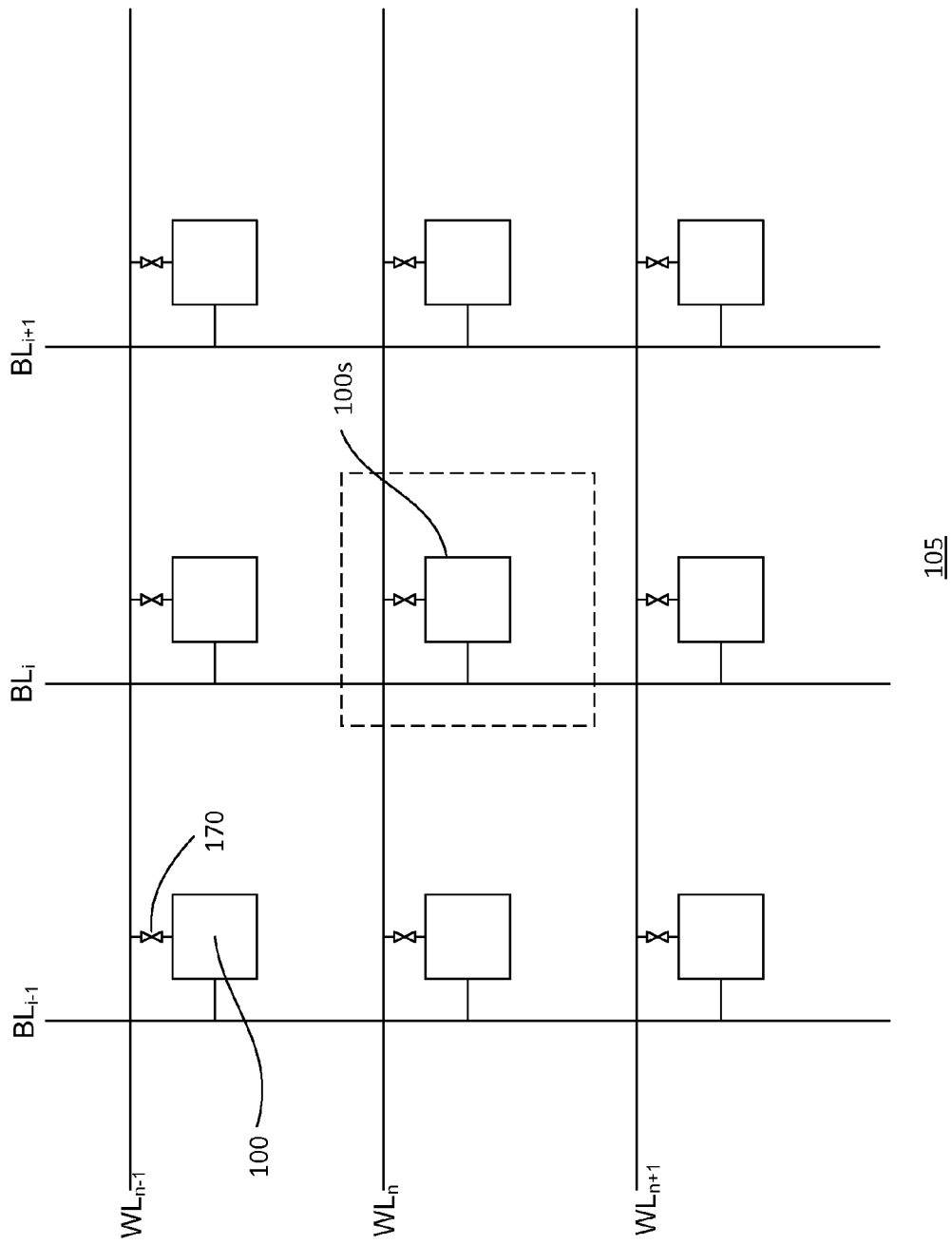

FIG. 1c shows a portion of a memory cell array 105. The portion, as shown, is a 3×3 array of memory cells 100, as described in FIG. 1a. For example, a memory cell includes a cell selector which is a transistor. The memory cells are interconnected by WLs, BLs and SLs. The array, for example, includes WLs and SLs in a first or row direction and BLs in a second or column direction. The first and second directions, for example, are orthogonal. Providing non-orthogonal first and second directions may also be useful. FIG. 1d shows a portion of a memory cell array 105 for the case where a cell selector 170 is a diode. As shown, the cell selector is coupled to the storage unit of a memory cell and a WL.

An active signal at the WL selects a row of cells associated with the activated WL. To select a cell within the row of the activated WL, an appropriate BL voltage is provided at the BL associated with the selected cell. For example, an active signal at WL, and an appropriate BL voltage at BL, selects memory cell 100s. The appropriate voltage, in one embodiment, has a magnitude which is larger than the sum of the threshold of the cell selector and the threshold of the PCM.

Table 1a below shows signals at BL, WL and SL for a program access for the selected memory cell:

TABLE 1a

| Program Access | BL | WL | SL |
|---|---|---|---|
| Bit = 0 | RESET Pulse (R: high Resistance) | $V_{WLA}$ | GND |
| Bit = 1 | SET Pulse (R: low Resistance) | $V_{WLA}$ | GND |

Table 1a, as shown, reflects signals for logic 1 as being low impedance and logic 0 as being high impedance. In the case that logic 1 corresponds to high impedance and logic 0 corresponds to low impedance, the SET and RESET signals may be switched. To perform a read access, the signals applied to the bitlines (read pulses) may be similar, but lower than the threshold voltage of the PCM. For example, the magnitude of the read voltage applied to the BL is less than the melt and crystallization temperature of the PCM. As for $V_{WLA}$ signal, it is equal to the active signal at the WL to select a row of cells. For non-selected rows, an inactive WL signal $V_{WLI}$ is provided. For example $V_{WLA}$ may be a logic 1 signal and a $V_{WLI}$ is a logic 0 signal. For example, in the case of FIG. 1c, $V_{WLA}$ is applied to $WL_n$, and SET and RESET signals are applied to $BL_j$. For BLs of unselected cells, they are floated or in a high impedance state (Z state). As for the SLs, they may be coupled to the substrate well or ground, effectively forming a common SL. Other configurations of signals may also be useful.

Table 1b shows various voltage values for the different signals for BLs, WLs and SLs of a memory array.

TABLE 1b

| Signals | Value (V) |
|---|---|
| $V_{WLA}$ | About 1.8 |
| $V_{WLI}$ | 0 |
| $V_{SL}$ | 0 |
| $V_{BL}$ (unselected) | Floating or high-Z state |
| $V_{BL}$ RESET Pulse | About 50 ns duration with peak V of about 1.8~2.5 V |
| $V_{BL}$ SET Pulse | About 100~300 ns duration with peak V of about 1.8~2.8 V |
| $V_{BL}$ Read Pulse | About 50~150 ns duration at about 1.2~1.5 V |

The values of the signal provided in Table 1b are exemplary. These values may change, depending on, for example, the technology. The various signals should be sufficient to achieve the objective, such as performing the memory access (e.g., programming and reading). Furthermore, it is understood that the stimuli for setting and resetting is the current which is produced by the voltage pulses. The voltage pulses are provided to produce the desired SET and RESET currents. For example, in the case of a SET current, it may be about 120 µA while the RESET current is about 200 µA for 40 nm node. Other SET and RESET current values may also be useful. As for the Read pulse, it may have a shorter duration, such as about 12~25 ns for a resistive element set at about 50~1000 ohms. Other Read pulse durations may also be useful.

Figure 1E:
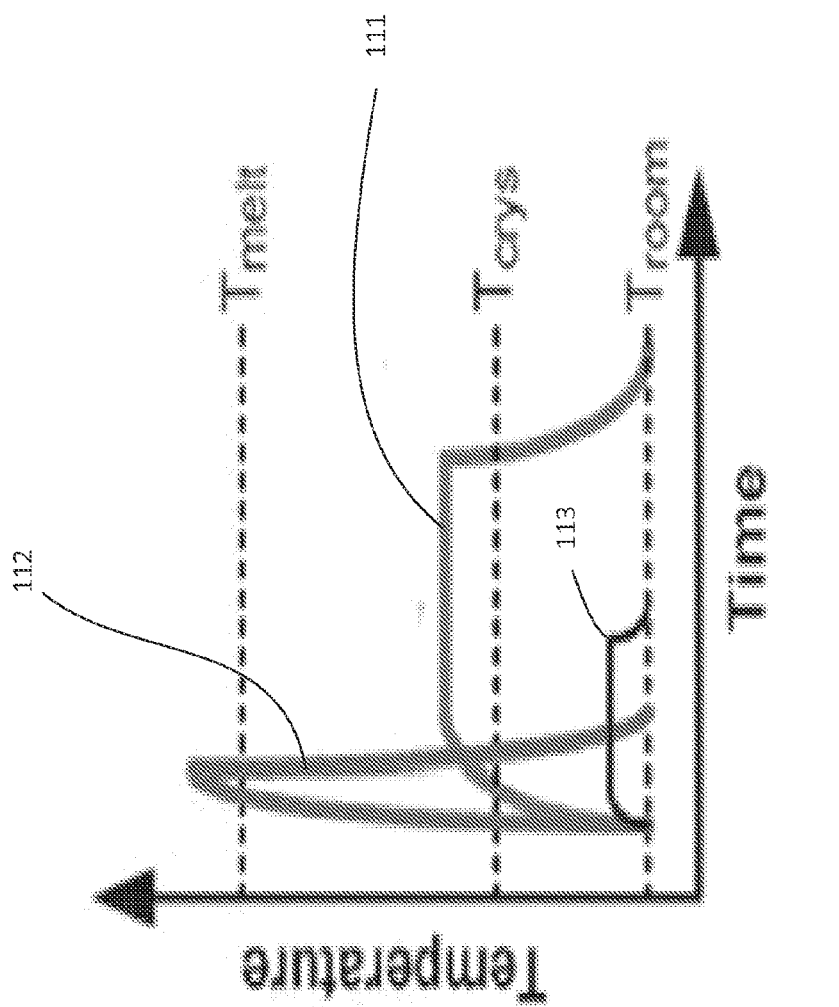
FIG. 1e shows an embodiment of temperature-time plot.

FIG. 1e shows an embodiment of temperature-time plot 108 for the SET, RESET and READ pulses. Referring to FIG. 1e, curve 111 is the SET pulse. As shown, the SET pulse has a slow rise time to above the crystallization temperature of the PCM. The SET pulse, once it reaches the peak temperature, has a linear portion and a slow fall time to room temperature. This is to ensure that the PCM sufficiently crystallizes after being above the crystallization temperature. As for the RESET pulse 112, it has a fast rise time to above the melting temperature of the PCM and a fast fall time to room temperature. This is to ensure that the PCM melts and does not have a chance to crystallize. As for the read pulse 113, it has a peak voltage below the crystallization temperature. The read pulse remains at the peak read voltage sufficiently long to perform the read access. This ensures that the phase of the PCM is not changed.

Figure 2A:
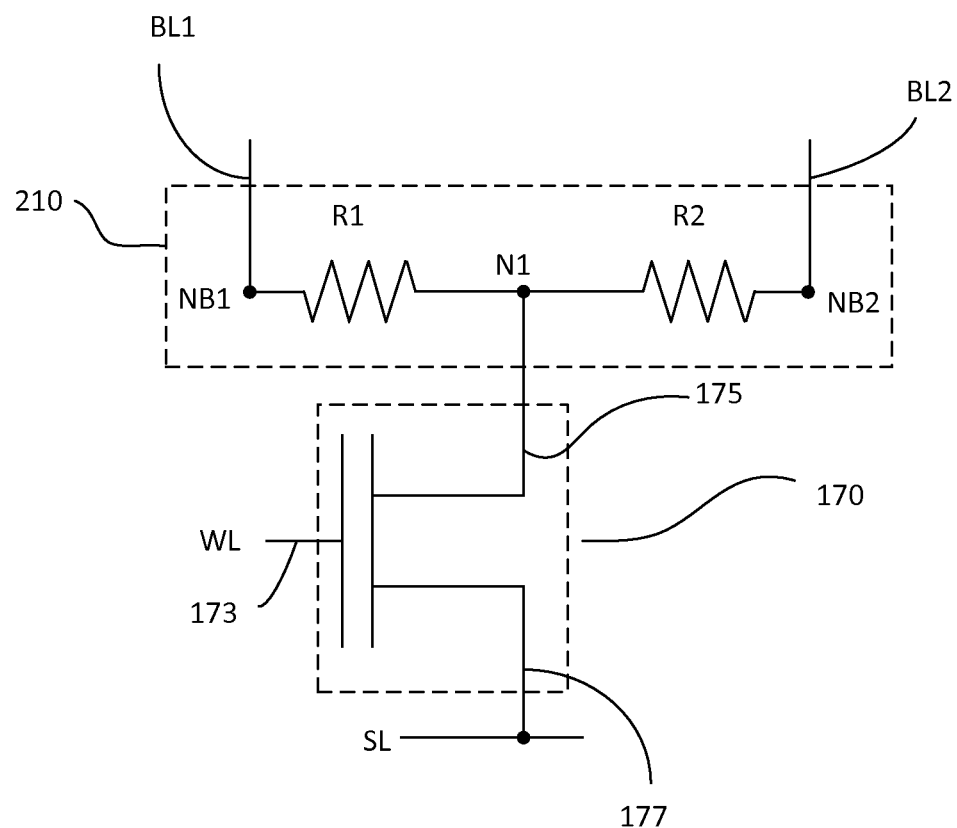
FIGS. 2a-b show schematic diagrams in accordance with embodiments of a device.

FIG. 2a shows a schematic diagram of an embodiment of a device. In one embodiment, the device includes a memory cell 200. The memory cell is similar to that described in FIGS. 1a-b. Common elements may not be described or described in detail. The memory cell, in one embodiment, is a resistive-type memory cell.

As shown, the memory cell includes a plurality of resistive elements. In one embodiment, the memory cell includes first and second resistive elements R1 and R2. Providing other number of resistive elements may also be useful. The resistive elements are employed for storing information. In one embodiment, the resistive elements include PC elements. A storage unit includes a PC element and a heating element. The resistive elements and heating elements, for example, form a storage unit 210 of the memory cell. The storage unit includes first and second sub-storage units. Providing a storage unit with other number of sub-storage units may also be useful.

A resistive element includes first and second resistive element terminals (RETs). In one embodiment, first RETs of the resistive elements are commonly coupled and form a first node N1 of the storage unit. The second RET of R1 forms a first bitline node NB1 of the storage unit and the second RET of R2 forms a second bitline node NB2 of the storage unit. A first bitline BL1 is coupled to NB1 and a second bitline BL2 is coupled to NB2. As for N1, it is coupled to a cell selector 170. The cell selector, in one embodiment, is a transistor. As shown, the cell selector is a metal oxide semiconductor (MOS) transistor. The transistor includes a gate and first and second transistor terminals 173, 175 and 177. The first transistor terminal is coupled to N1. As for the second transistor terminal, it is coupled to a select line SL while the gate terminal is coupled to a WL.

Figure 2B:
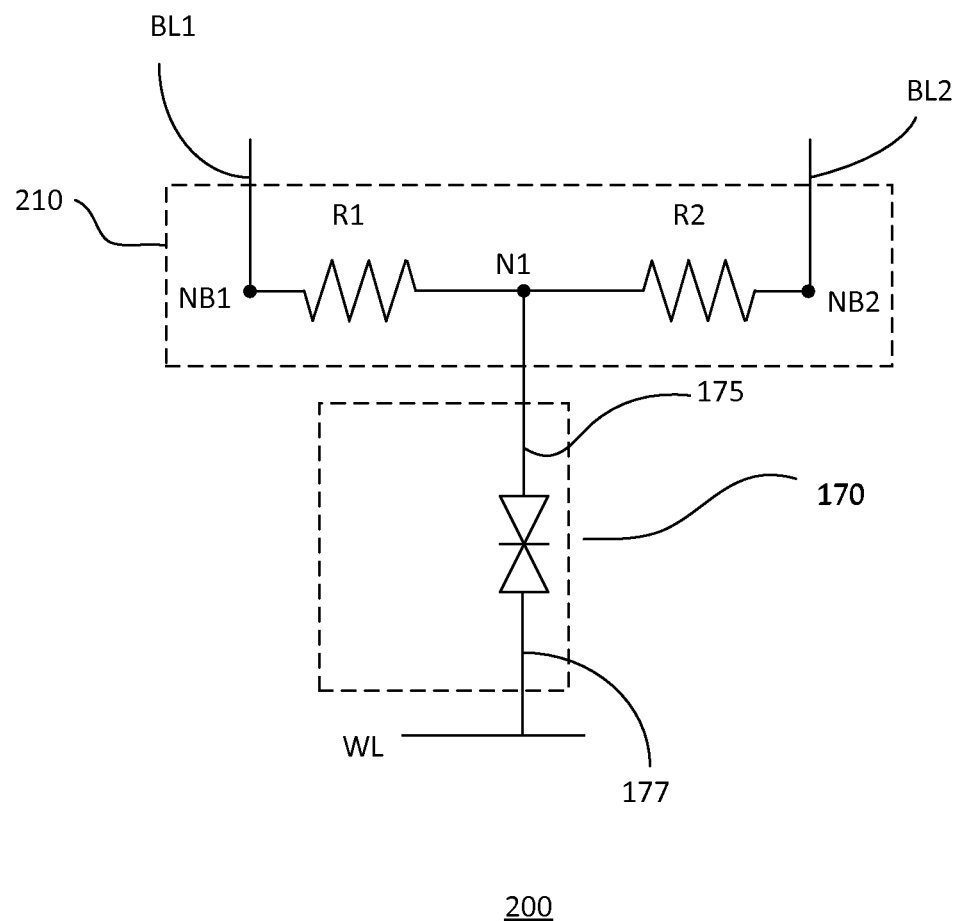

In other embodiments, the cell selector may be a bipolar junction transistor (BJT). For example, a first terminal of the BJT may be coupled to N1, a second terminal may be coupled to SL while a base of the BJT is coupled to WL. The first and second terminals are the collector and emitter terminals of the BJT. For example, in the case of a NPN BJT, the collector is coupled to the N1 and the emitter is coupled to SL. Other types of cell selectors may be employed. For example, in some cases, a diode may be used as a cell selector, as shown in FIG. 2b. In such cases, the diode is provided between N1 and WL, forming a cross-point type of memory cell. For example, a first terminal 175 of the diode is coupled to N1 while a second terminal 177 of the diode is coupled to WL. No SLs are employed for cell selectors which are diodes.

In one embodiment, a plurality of storage units may be coupled in parallel through N1 to a cell selector. For example, the cell selector can be used to select a plurality of storage units. Each storage unit (or sub-storage unit) is coupled to its respective BL. This enables a cell selector to select a plurality of storage units. Providing multiple storage units coupled to a cell selector is described in, for example, co-pending U.S. patent application Ser. No. 13/802,899, titled "Stackable Non-Volatile Memory", which is herein incorporated by reference for all purposes.

Figure 2C:
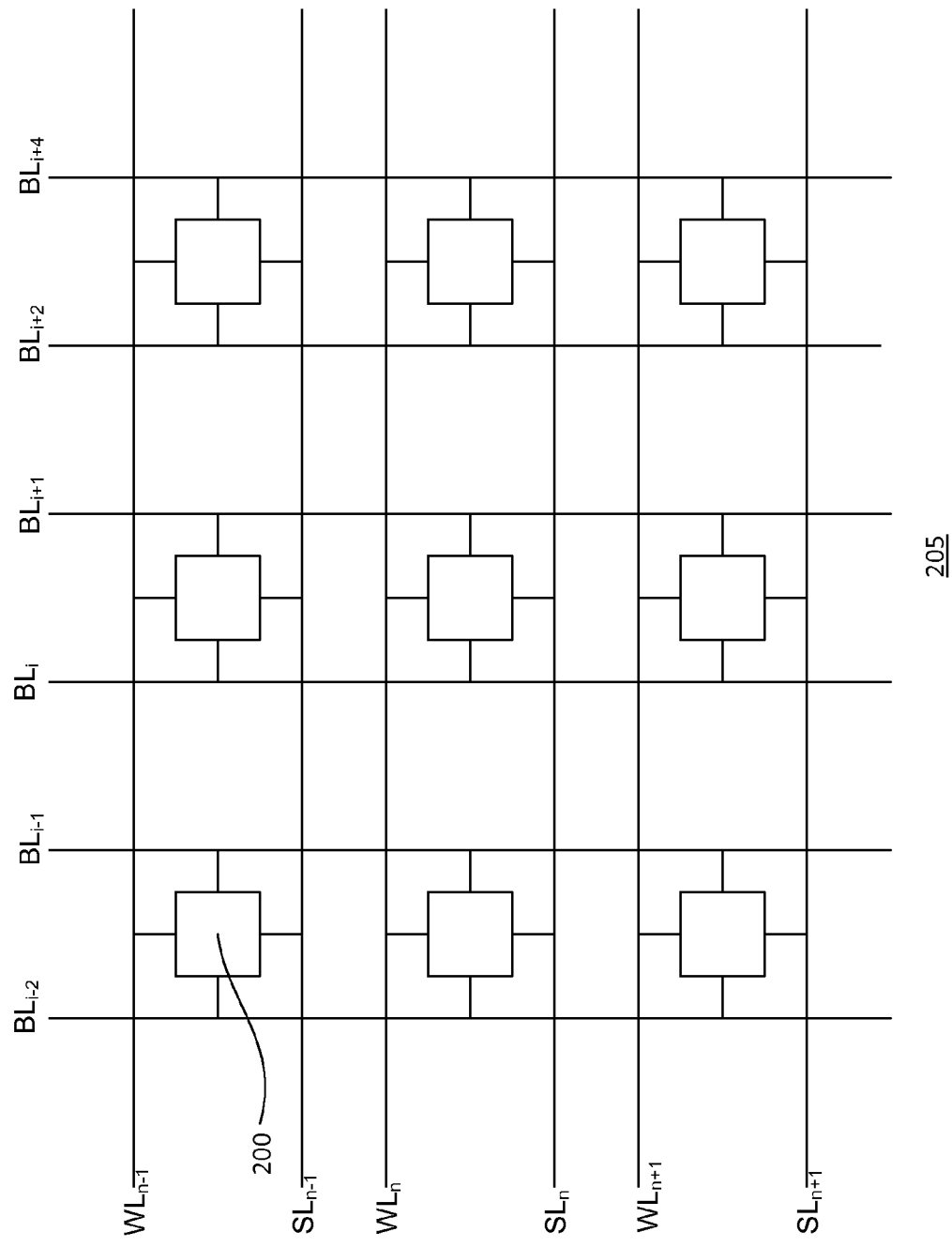
FIGS. 2c-d show portions of a memory cell array.
Figure 2D:
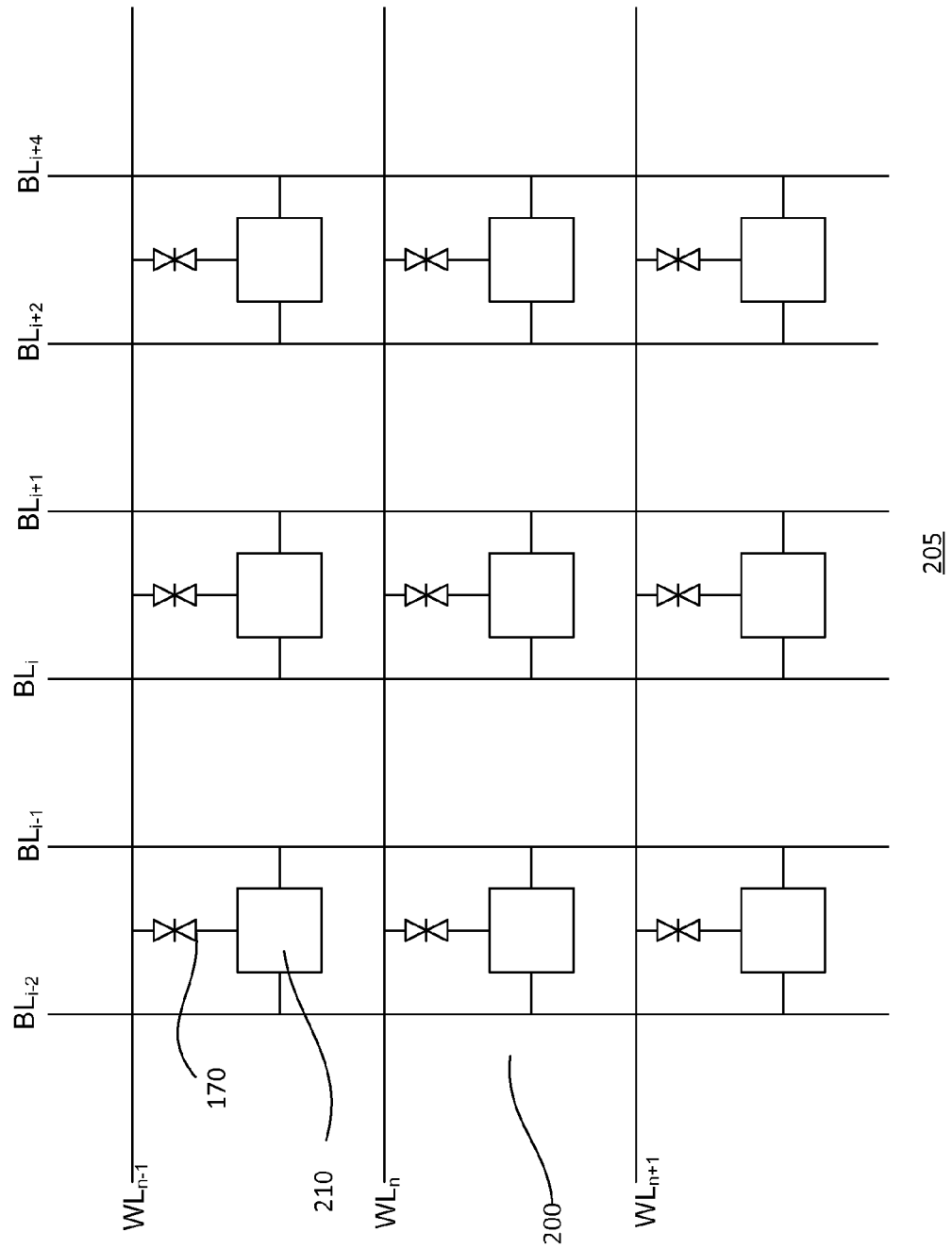

FIG. 2c shows a portion of a memory cell array 205. The portion, as shown, is a 3×3 array of memory cells 200, as described in FIG. 2a. For example, a memory cell includes a cell selector which is a transistor. The memory cells are interconnected by WLs, BLs and SLs. A memory cell is coupled to a WL, SL and first and second BLs. The array, for example, includes WLs and SLs in a first or row direction and BLs in a second or column direction. The first and second directions, for example, are orthogonal. Providing non-orthogonal first and second directions may also be useful. FIG. 2d shows a portion of a memory cell array 205 for the case where a cell selector 170 is a diode. As shown, the cell selector is coupled to the storage unit 210 of a memory cell and a WL.

The memory cells, as described in FIGS. 2a-b, may be configured in different modes. For example, the memory cell may be configured as a multi-level cell (MLC). A memory cell includes multiple bits. For example, a dual-level cell (DLC) includes two bits, associated with BL1 and BL2. Alternatively, the memory cell may be configured as a single-level cell (SLC). In the SLC, the resistive elements are in opposite states. For example, the first and second resistive elements represent one bit of the memory cell.

An active signal at the WL selects a row of cells associated with the activated WL. To select a cell within the row of the activated WL, appropriate voltages are provided at the BLs. BLs of non-selected bits or cells are floated or in a high impedance state.

Table 2a below shows signals at BLs, WL and SL for a program access for a memory cell with first and second resistive elements configured in the SLC mode:

TABLE 2a

| Program Access | BL1 | BL2 | WL | SL |
|---|---|---|---|---|
| Bit = 0 | RESET Pulse (R1: high R) | SET Pulse (R2: Low R) | $V_{WLA}$ | GND |
| Bit = 1 | SET Pulse (R1: low R) | RESET Pulse (R2: high R) | $V_{WLA}$ | GND |

Table 2a, as shown, reflects signals for logic 1 as being low impedance and logic 0 as being high impedance and BL1 is the true port and BL2 is the complementary port. In the case that logic 1 corresponds to high impedance and logic 0 corresponds to low impedance, the SET and RESET signals may be switched. To perform a read access, the signals applied to the bitlines (read pulses) may be similar, but lower than the threshold voltage of the PCM. For example, the magnitude of the read voltage applied to the BLs is less than the melt and crystallization temperature of the PCM. As for $V_{WLA}$ signal, it is equal to the active signal at the WL to select a row of cells. For non-selected rows, an inactive WL signal $V_{WLI}$ is provided. For example $V_{WLA}$ may be a logic 1 signal and a $V_{WLI}$ is a logic 0 signal. For BLs of unselected cells, they are floated or in a high impedance state (Z state). As for the SLs, they may be coupled to the substrate well or ground, effectively forming a common SL. Other configurations may also be useful. In the SLC mode, read pulses are applied to BLs of the memory cell (e.g., BL1 and BL2).

Table 2b below shows signals applied to the WL, SL and BLs for a program access for a memory cell configured in the MLC mode:

TABLE 2b

| Program Access | BL1 | BL2 | WL | SL |
|---|---|---|---|---|
| Bit 1 = 0 | RESET Pulse (R1: high R) | Floating or High Z | $V_{WLA}$ | GND |
| Bit 1 = 1 | SET Pulse (R1: low R) | Floating or High Z | $V_{WLA}$ | GND |
| Bit 2 = 0 | Floating or High Z | RESET Pulse (R2: high R) | $V_{WLA}$ | GND |
| Bit 2 = 1 | Floating or High Z | SET pulse (R2: low R) | $V_{WLA}$ | GND |

Table 2b, as shown, reflects signals for logic 1 as being low impedance and logic 0 as being high impedance. In the case that logic 1 corresponds to high impedance and logic 0 corresponds to low impedance, the SET and RESET signals may be switched. To perform a read access, the signals applied to the bitlines (read pulses) may be similar, but lower than the threshold voltage of the PCM. For example, the magnitude of the read voltage applied to the BLs is less than the melt and crystallization temperature of the PCM. As for $V_{WLA}$ signal, it is equal to the active signal at the WL to select a row of cells. For non-selected rows, an inactive WL signal $V_{WLI}$ is provided (e.g., ground). In the MLC mode, a read pulse is applied to BL of the selected bit of the memory cell (e.g., BL1 or BL2). The values of the various access signals in Tables 2a-b may be similar to those provided in Table 1b and they are exemplary. These values may change, depending on, for example, the technology.

The various signals should be sufficient to achieve the objective, such as performing the memory access (e.g., programming and reading) on the desired bit of the memory cell. Furthermore, it is understood that the stimuli for setting and resetting is the current which is produced by the voltage pulses. The voltage pulses are provided to produce the desired SET and RESET currents. For example, in the case of a SET current, it may be about 120 μA while the RESET current is about 200 μA for 40 nm node. Other SET and RESET current values may also be useful. As for the Read pulse, it may have a shorter duration, such as about 12~25 ns for a resistive element set at about 50~1000 ohms. Other Read pulse durations may also be useful.

Figure 3A:
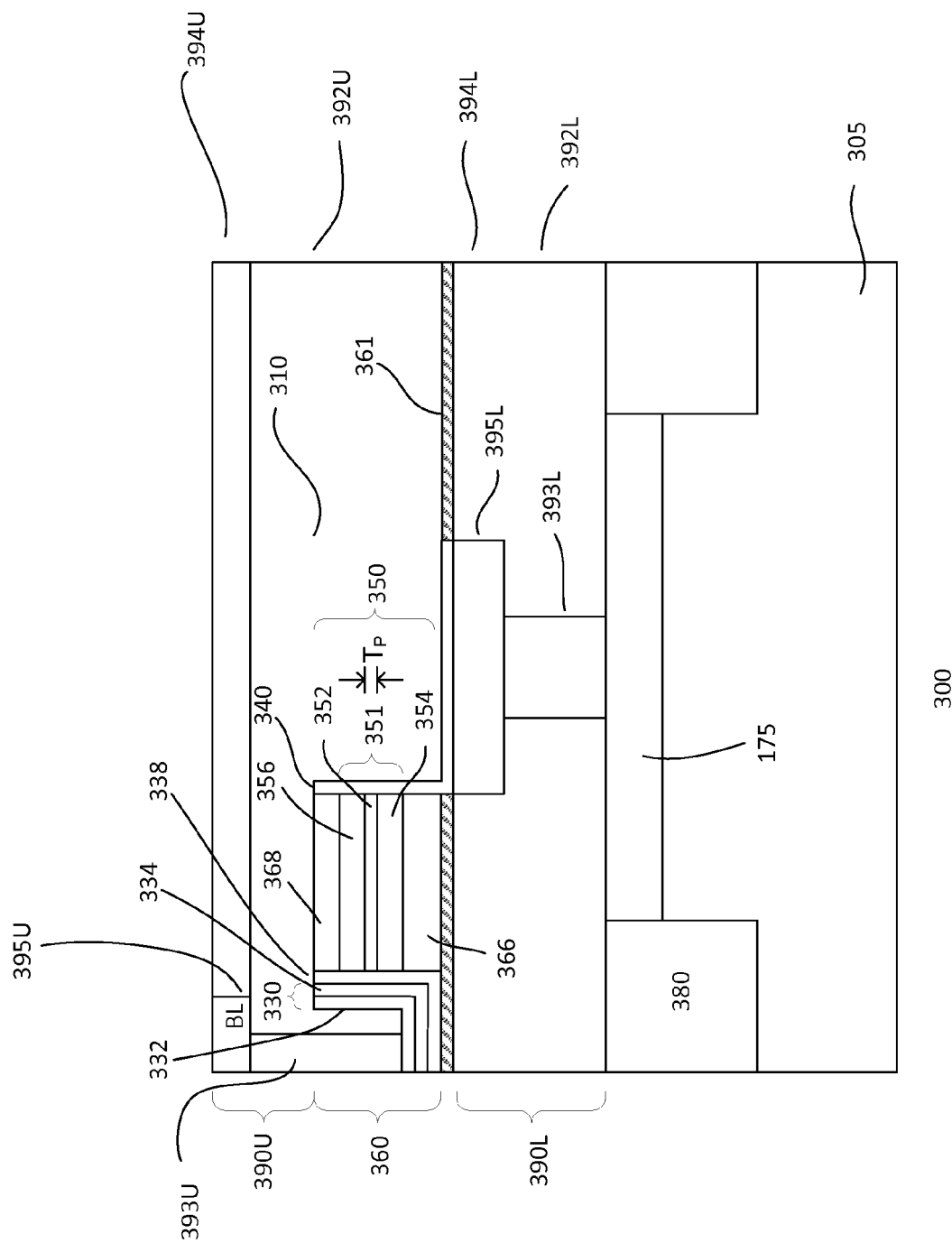
FIG. 3a shows exemplary embodiment of a device.
Figure 3B:
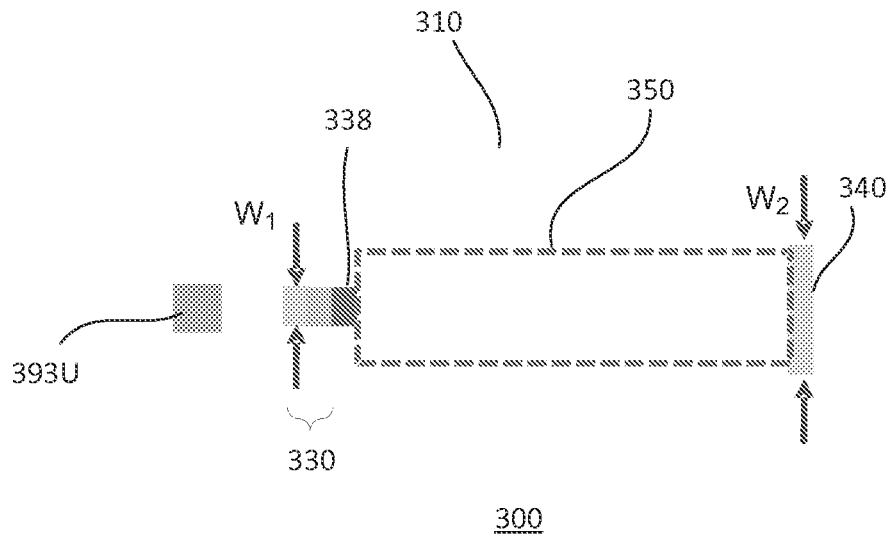
FIGS. 3b-d show plan views of embodiments of a device.
Figure 3C:
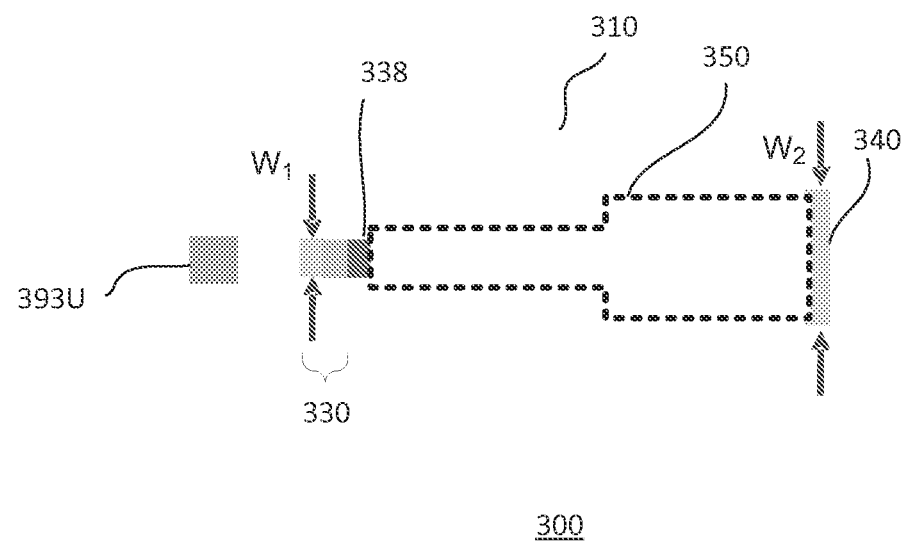
Figure 3D:
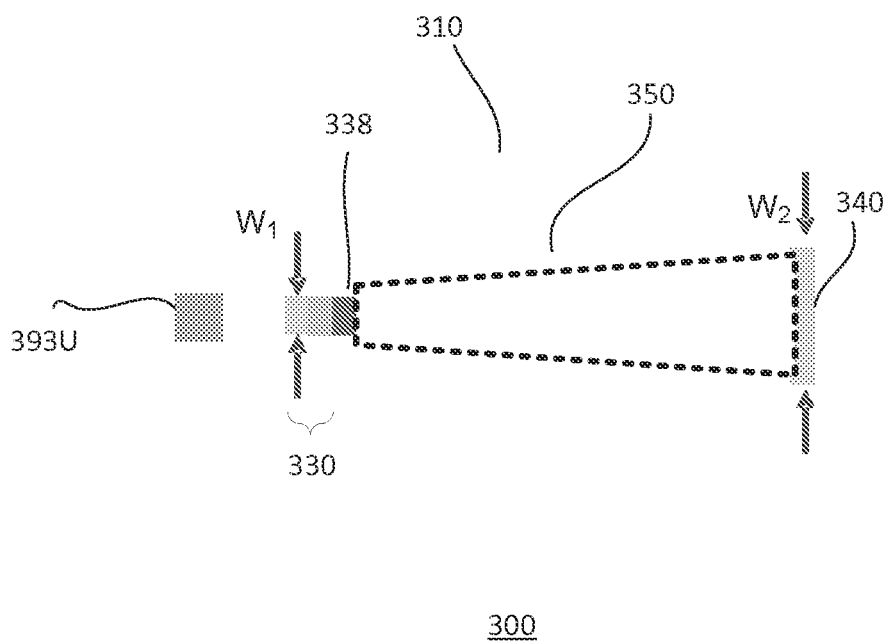

FIG. 3a shows a cross-sectional view of an embodiment of a device 300. FIGS. 3b-d show top views of various embodiments of the device. The cross-sectional view, for example, is along a first or wordline direction. A perpendicular direction to the first direction may be the bitline direction. The device includes a memory cell. In one embodiment, the memory cell is similar to the memory cell described in FIG. 1a. Common elements may not be described or described in detail.

The memory cell is disposed on a substrate 305. The substrate, for example, is a semiconductor substrate, such as a silicon substrate. For example, the substrate may be a lightly doped p-type substrate. Providing an intrinsic or other types of doped substrates, such as silicon-germanium (SiGe), germanium (Ge), gallium-arsenic (GaAs) or any other suitable semiconductor materials, may also be useful. In some embodiments, the substrate may be a crystalline-on-insulator (COI) substrate. A COI substrate includes a surface crystalline layer separated from a crystalline bulk by an insulator layer. The insulator layer, for example, may be a dielectric insulating material. The insulator layer, for example, is formed from silicon oxide, providing a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be the same material.

The memory cell includes a storage unit 310 disposed between two interlevel dielectric (ILD) layers on the substrate. For example, the storage unit is disposed in a cell dielectric layer 360 between upper and lower ILD layers 390U and 390L. The cell dielectric layer, for example, may be formed of silicon oxide. Other types of dielectric layers may also be useful. As for the ILD layers, they may be formed of silicon oxide. Other types of dielectric materials may also be useful for the ILD layers. It is understood that the different ILD layers need not be formed of the same material or have the same configuration.

An ILD layer includes a metal level and a contact level. For example, the upper ILD layer 390U includes an upper metal level 394U and an upper contact or via level 392U while the lower ILD layer 390L includes a lower metal level 394L and a lower contact level 392L. Metal levels include conductors while contact levels include contacts. For example, upper metal level includes upper conductors 395U, upper contact level includes upper contacts 393U, lower metal level includes lower conductors 395L and lower contact level includes lower contacts 393L. The conductors and contacts may be formed of a metal, such as copper, copper alloy, aluminum, tungsten or a combination thereof. Other suitable types of metal, alloys or conductive materials may also be useful. In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different.

In one embodiment, the lower metal level is the first metal level M1 and the upper metal level is a second metal level M2 of the device. In such case, the lower contact level is a pre-metal dielectric (PMD) or contact (CA) level and the upper contact level is a first via level V1. Contacts at the PMD level may be tungsten contacts while contacts at the V1 level may be copper or copper alloy. Other types of conductive materials, such as aluminum, may also be useful. Other configurations of contacts at the contact levels may also be useful.

In general, the storage unit may be disposed between any two metal levels of the device. For example, the storage unit may be disposed between any two metal layers, such as M2 and M3. In such case, a contact and contact pad may be provided in CA and M1 to facilitate electrical connections to, for example, the cell selector. In some instances, the contact may be a direct contact which extends through CA and M1. Other contact configurations may also be useful. Disposing the storage unit between other metal levels may also be useful. Preferably, the storage unit is disposed between two adjacent metal layers. Disposing the storage unit between non-adjacent metal layers may also be useful. For example, the storage unit may be disposed between M1 and M3. Disposing the storage unit between other non-adjacent metal levels may also be useful. Contacts may be provided in one or more intermediate ILD levels to facilitate connections between two non-adjacent metal layers (e.g., M1 and M3). The contact may be a direct contact or a contact at the via level (e.g., V1) and a metal pad at the metal level (e.g., M2). Other contact configurations may also be useful.

The storage unit is disposed within a cell dielectric layer 360 located between the lower metal level and upper contact level. The cell dielectric layer may be formed of silicon oxide. Other types of dielectric materials may also be useful for the cell dielectric layer. The cell dielectric layer may be formed of different dielectric layers. The different dielectric layers may be formed of the same material. Providing the dielectric layers with different materials may also be useful. For example, low k dielectric materials may be used. In some cases, bad thermal conducting dielectric materials may be used, for example, to reduce thermal cross-talk. Other configurations of the dielectric layers may also be useful. The cell dielectric layer, for example, may be considered as part of the upper ILD layer.

In one embodiment, a dielectric liner 361 is disposed between the cell dielectric layer and the lower ILD layer. The dielectric liner, for example, serves as an etch stop layer. In one embodiment, the dielectric liner is formed of a low k dielectric. For example, the dielectric liner may be nBLOK. Other types of dielectric materials for the dielectric liner may also be useful.

The storage unit includes a cell stack 350. The width and length of the cell stack, for example, are greater than the minimum lithographic critical dimension (CD). The cell stack includes a programming stack 351 disposed between lower and upper stack dielectric layers 366 and 368. The cell stack dielectric layers, for example, may be silicon oxide. Other types of dielectric materials may also be useful. For example, the dielectric layers may be silicon oxynitride, silicon nitride or a combination thereof. In one embodiment, the programming stack includes a heater layer 352. The heater layer, for example, may be formed of an electrical connection material (ECM). The heater, in one embodiment, includes a high conductivity ECM, such as TiN. Other types of ECMs with appropriate or high conductivity may also be useful. The type of ECM may depend on, for example, the storage layer.

The heater layer has a thickness $T_p$. The thickness $T_p$ of the heater layer, in one embodiment, is less than the lithographic CD. The thickness $T_p$, for example, may be about 5-10 nm or less. Other thicknesses for $T_p$ may also be useful.

The heater layer is disposed between lower and upper heat shield layers 354 and 356. In one embodiment, the heat shield layers are formed of a PCM. For example, the heat shield layers are PC layers. The PCM, in one embodiment, is a chalcogenide material. In one embodiment, the chalcogenide material is a GeSbTe alloy. In another embodiment, the chalcogenide material is $Ge_2Sb_2Te_5$ (GST). Other types of chalcogenide or PCMs as well as other types of dielectric layers with low thermal conductivity may also be employed. The heat shield layers sandwich the heater, preventing heat loss therefrom. The thickness of the heat shield layers may be about 20-100 nm. Other thicknesses may also be useful.

The heat shield layers may include a capping or protective layer. For example, a capping layer may be on a surface not in contact with the heater. Providing capping layers on both surfaces of a heat shield layer may also be useful. Other configurations of capping layers may also be useful. The capping layer may be employed to reduce oxidation or poor interface viscosity between layers. The capping layer, for example, may be silicon nitride or silicon oxynitride. Other types of capping layers may also be useful. The thickness of the capping layer, for example, may be about 20 nm. Other thicknesses may also be useful.

The cell stack includes opposing first ends along the first direction. For example, the cell stack includes opposing first ends along the wordline direction. A storage liner 338 lines at least the sidewall of the cell stack at one of the opposing first ends. For example, the storage liner lines at least the sidewall of the first opposing first end of the cell stack. As shown, the storage liner lines the sidewall of the cell stack at the first opposing first end and lower ILD layer, forming an L-shaped storage liner. For example, the storage liner lines the sidewall of the cell stack at the first opposing first end and the dielectric liner above the lower ILD layer. In one embodiment, the width of the storage liner is less than a width of the first opposing first end. For example, a width of the storage liner may be about the lithographic CD while the width of the first opposing first end is greater than the lithographic CD. Providing other widths for the storage liner may also be useful. The thickness of the storage liner may about 5-10 nm or less. Other thicknesses may also be useful.

In one embodiment, the storage liner is formed of a PCM. For example, the storage layers are PC layers. The PCM, in one embodiment, is a chalcogenide material. In one embodiment, the chalcogenide material is a GeSbTe alloy. In another embodiment, the chalcogenide material is $Ge_2Sb_2Te_5$ (GST). Other types of chalcogenide or PCMs may also be employed.

The storage liner may include a capping or protective layer. For example, a capping layer may be on a surface not in contact with ILD or cell stack. For example, the capping layer may be provided on the top surface of the storage liner. Providing it on the bottom surface of both surfaces of the storage liner may also be useful. The capping layer may be employed to reduce oxidation or poor interface viscosity between layers. The capping layer, for example, may be silicon nitride or silicon oxynitride. Other types of capping layers may also be useful. The thickness of the capping layer, for example, may be about 20 nm. Other thicknesses may also be useful.

In one embodiment, the sidewall of the cell stack may include a thin insulator layer. For example, the thin insulator layer is disposed between the cell stack and storage liner. The thin insulator layer may be a thin silicon oxide layer. Other types of insulators may also be useful. The thin insulator layer may serve as a high voltage breakdown layer for initializing the procedure of the memory cell. Such a high voltage breakdown will introduce a conductive path, the cross section area of which is usually much smaller than the product of litho CD and heater layer thickness. For example, the initialization procedure forms dielectric or heating islands. Dielectric or heating islands are disclosed in, for example, U.S. patent application Ser. No. 13/802,841, titled "Resistive Non-Volatile Memory", which is herein incorporated by reference for all purposes.

A top electrode (TE) layer 330 is disposed on the storage liner. The TE layer, for example, is formed of an ECM. The ECM, for example, has good conductivity and good interface with the PCM. In one embodiment, the TE layer is formed of an ECM with bad thermal conductivity to serve as a heat shield. For example, the TE layer may be a TaN layer. Other types of ECMs may also be useful. The TE layer is coupled to a bitline BL. For example, the TE layer is coupled to the BL by a contact. The contact may extend from the upper contact level through the cell dielectric layer. The TE layer provides connection for the bitline to the storage unit. In the case where the TE layer is an ECM with bad thermal conductivity, it also serves as a heat shield.

In some embodiments, the TE layer may be a TE stack having multiple layers. For example, the TE stack may include first and second TE layers 332 and 334. The first TE layer, in one embodiment, contacts the BL. The second TE layer is disposed below that first TE layer and contacts the storage liner. In one embodiment, the first TE layer is formed of an ECM with good conductivity and low thermal conductivity. For example, the first TE layer is formed of TaN, serving as a heat shield and providing connection for the BL to the storage unit. Other types of ECMs may also be useful. As for the second TE layer, it is formed of an ECM which provides good conductivity and good interface with the PCM. For example, the second TE layer may be formed of TiN. Other types of ECMs may also be useful. Other configurations of the TE stack may also be useful. The TE and storage liner may be collectively referred to as TE storage stack.

A bottom electrode (BE) layer 340 at least lines the sidewall of the cell stack at the other of the opposing first end. For example, the BE layer at least lines the sidewall of the cell stack at the second opposing first end. In one embodiment, the BE layer lines the sidewall of the cell stack at a second opposing first end and lower ILD layer. In one embodiment, the cell dielectric includes an opening exposing the drain pad. The BE layer may line the sides of the opening, including second opposing side of the cell stack, and bottom, contacting a drain pad 395L disposed in the lower metal level 394L. For example, the dielectric liner includes an opening to expose the drain pad, enabling the BE layer to electrically couple to it. The BE layer, for example, is formed of an ECM with good electrical conductivity and bad thermal conductivity, such as TaN. Other types of ECMs may also be useful. Preferably, the BE is formed of the same material as the TE (or the first TE) layer. Other configurations of the electrode liner may also be useful.

The cell stack 350 may have various shapes from the top view. For example, the cell stack may have a rectangular shape, as shown in FIG. 3b. Other shapes may also be useful. For example, the cell stack may have a polygonal or a trapezoidal shape, as shown in FIGS. 3c-d. For non-rectangular shaped cell stacks, the narrower portion is disposed adjacent to the TE side while the wider portion is disposed adjacent to the BE side. The TE storage stack may have a rectangular shape. Other shapes may also be useful. The TE storage stack may have a width W1 along the BL direction. The width W1, for example, may be equal to the lithographic resolution. The width W1, for example, may depend on the technology node. For example, W1 may be about 40 nm for a 40 nm node. Other widths for W1 may also be useful. The width W1 is preferably as small as possible to minimize contact cross-section between the storage liner and heater element. In some cases, if current is sufficiently small, W1 may be larger than lithographic CD. This reduces cost due to non-CD mask or reticle.

As described, the TE storage stack has a width W1. The width W1 may be equal to CD to minimize contact area with the heater element to improve heating efficiency. It is understood that the width W1 is only related to the portion which contacts the sidewall of the first opposing first end. It is understood that the width of the TE stack may have a wider width W1c for forming contacts to the BL at a contact portion of the TE stack. The width W1c may be sufficient to accommodate a contact. This improves electrical connectivity to the BL.

The width W2 of the BE, as shown, is wider than W1. For example, W2 is larger than the lithographic CD. As shown, W2 is wider than the width of the cell stack. This is because BE serves as a connection to the drain pad. There is no need to minimize the cross-sectional contact area to the heater as in the case of the storage liner. Providing a larger surface area increases current capacity. This reduces current crowding. Other widths for W2 may also be useful. For example, W2 may be the same as the width of the cell stack. Providing W2 which is narrower than the cell stack may also be useful.

A cell selector is provided. The cell selector may be provided on the substrate. In one embodiment, the cell selector is a MOS transistor. The MOS transistor may be a planar transistor. Providing a fin-type MOS transistor may also be useful. Other types of cell selectors, such as BJT or diodes, may also be useful. The MOS transistor includes a gate and first and second S/D regions in the substrate adjacent to the gate. The S/D regions may include lightly doped (LD) regions. The first S/D region 175, for example, serves as a drain while the second S/D region serves as a source. In one embodiment, the source is a common source region for an adjacent transistor of an adjacent row. The gate may include dielectric sidewall spacers.

In one embodiment, the source is coupled to a SL. For example, the source is coupled to the SL via a contact. As for the drain, it is coupled to the BE layer. For example, as shown in FIG. 3a, a drain contact 393L at the via or contact level and a drain pad 395L at the metal level may be provided to couple the cell stack to the drain. Other configurations of coupling the drain and cell stack may also be useful. In the case of a BJT, for example, NPN BJT, the collector is coupled to BE, the base is coupled to WL and the emitter is coupled to SL. In the case of a diode as a cell selector, the drain pad may be a wordline forming a row of memory cell.

Isolation regions 380 are provided. In one embodiment, the isolation region is a shallow trench isolation (STI) region. Other types of isolation regions may also be useful. The isolation regions are provided to separate columns of memory cells in the bitline direction and adjacent drain regions of select transistors of memory cells in the wordline direction.

Memory cells, as described, can be arranged in rows and columns, forming an array. Rows may correspond to wordlines and columns may correspond to bitlines. Cell selectors of two adjacent rows may be configured to share a common source region while the drain regions are not common, forming a transistor pair. A plurality of transistor pairs is arranged in the row and column directions. The transistor pairs are separated from each other by isolation regions. Gate conductors are disposed on the substrate and traverse the transistor pairs in the row direction. The gate conductors, for example, are polysilicon gate conductors.

In the case where a large number of memory cells are provided, strap cells may be provided. Strap cells, for example, are contacts which connect wordlines in a metal level to the gate. The use of strap cells to stitch connections between the wordlines and gate increases array performance. Strap cells, for example, may be provided at every 16 or 32 cells in the rows. Providing strap cells at other number of cells may also be useful.

In the case where strap cells are employed, it is preferable to avoid SLs and BLs in the same level. For example, WLs are provided in M1, SLs in M2 and BLs in M3, with storage units disposed between M2 and M3. Additional storage units may be stacked in metal levels above M3. Other configurations of WLs, SLs, BLs and storage units may also be useful. In the case of an array without strap cells, such as in the case of a small array, WLs are the gates, SLs are located in M1 and BLs are located in M2, with the storage units disposed between M1 and M2. Additional storage units may be stacked in metal levels above M2. Other configurations of WLs, SLs, BLs and storage units may also be useful.

As described, the storage element R1 of the memory cell is located in the storage liner at about the interface with the heater layer. The cross-sectional area of the interface of the resistive element and the heater can be designed to be small. For example, the cross-sectional area of the interface is equal to $W1 \times T_p$. Since $T_p$ is less than the minimum lithographic resolution and W1 can be equal to the minimum lithographic resolution, the cross-sectional area can be designed to be smaller than that of conventional devices. For example, the minimum cross-sectional area of the interface for conventional devices is equal to about the minimum lithographic resolution×minimum lithographic resolution. Providing a small cross-sectional area for the interface increases heating efficiency, therefore reducing programming current necessary for programming R1. This reduces power consumption of the device. Additionally, this may reduce cell size since the transistor required for generating the programming current can be smaller. This results in reduced manufacturing cost.

A plurality of storage units may be coupled in parallel to a cell selector. For example, the cell selector can be used to select a plurality of storage units. Each storage unit (or sub-storage unit) is coupled to its respective BL. This enables a cell selector to select a plurality of storage units. The storage units may be stacked one above another. For example, storage units may be disposed between adjacent metal levels and interconnected to the drain pad by contacts and pads. Stacking of storage units, for example, are described in co-pending U.S. patent application Ser. No. 13/802,899, titled "Stackable Non-Volatile Memory", which is already herein incorporated by reference for all purposes.

Figure 4A:
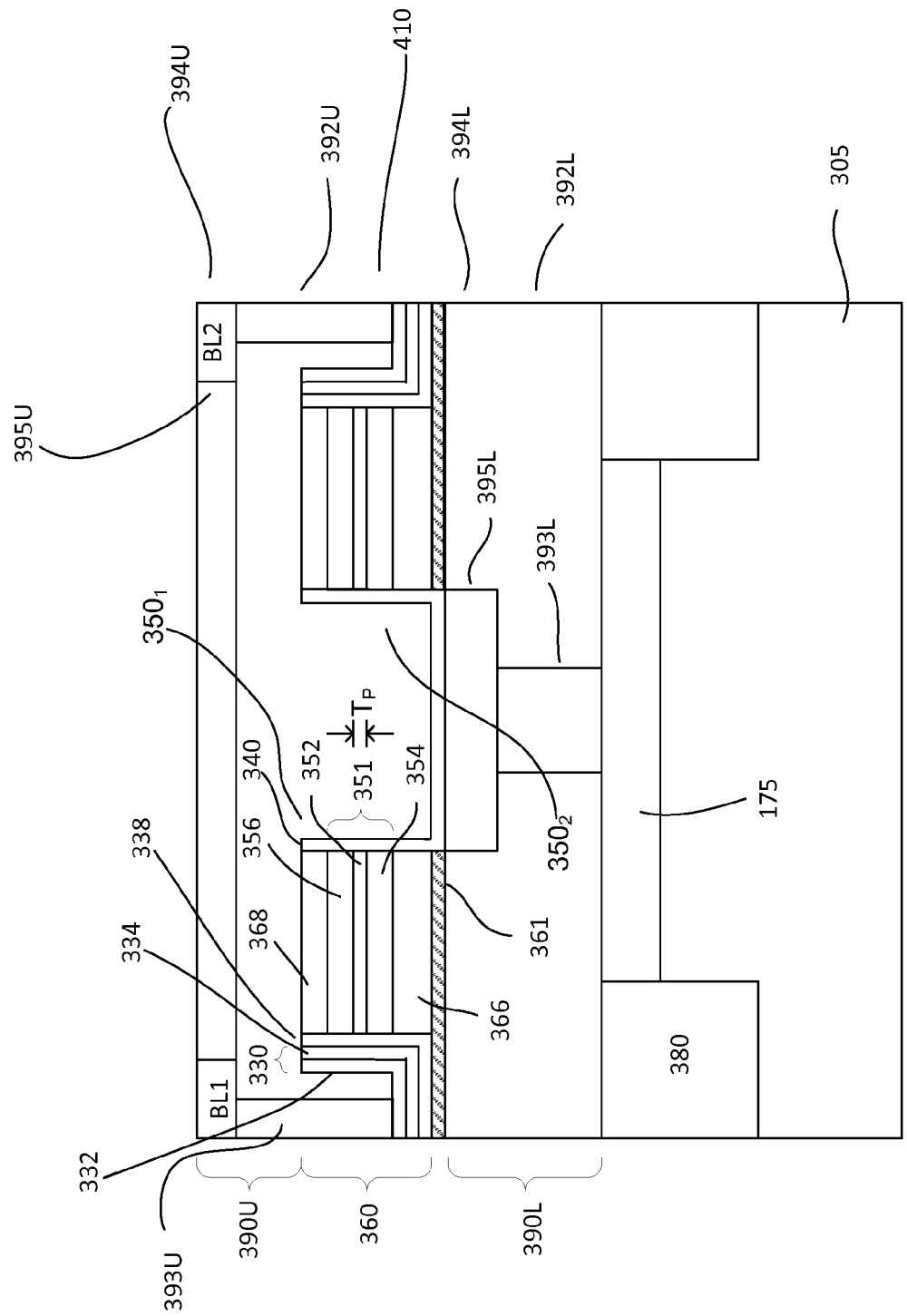
FIG. 4a shows another exemplary embodiment of a device.
Figure 4B:
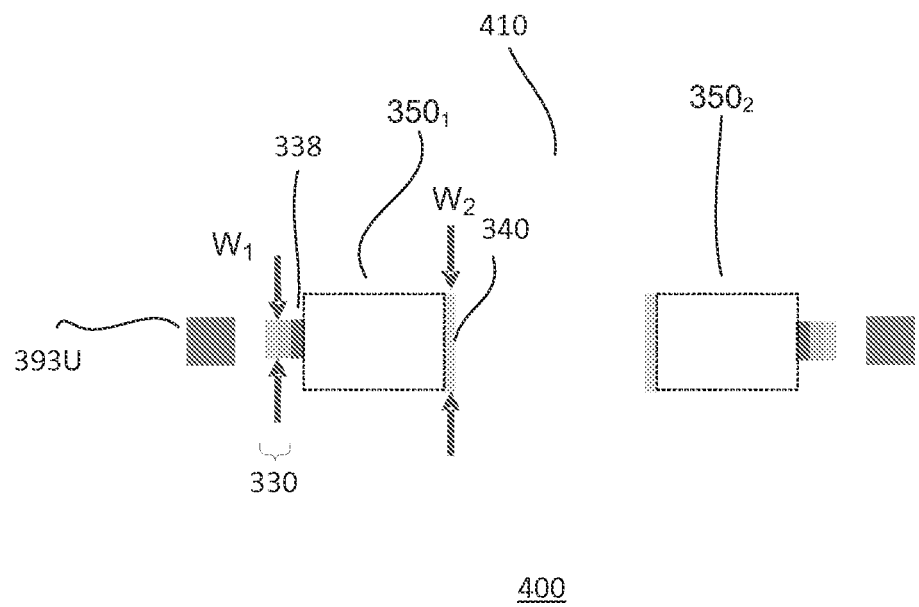
FIGS. 4b-d show plan views of embodiments of a device.
Figure 4C:
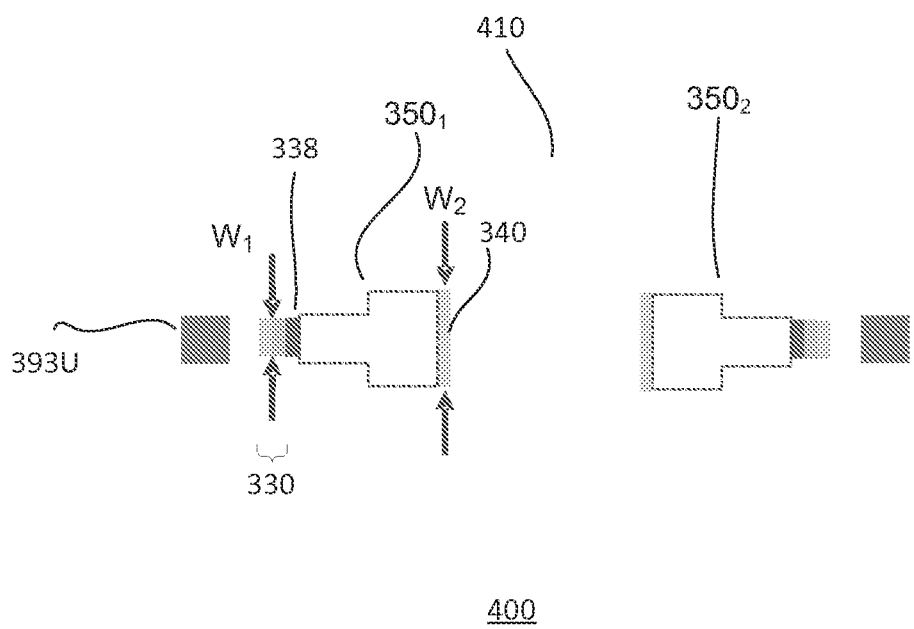
Figure 4D:
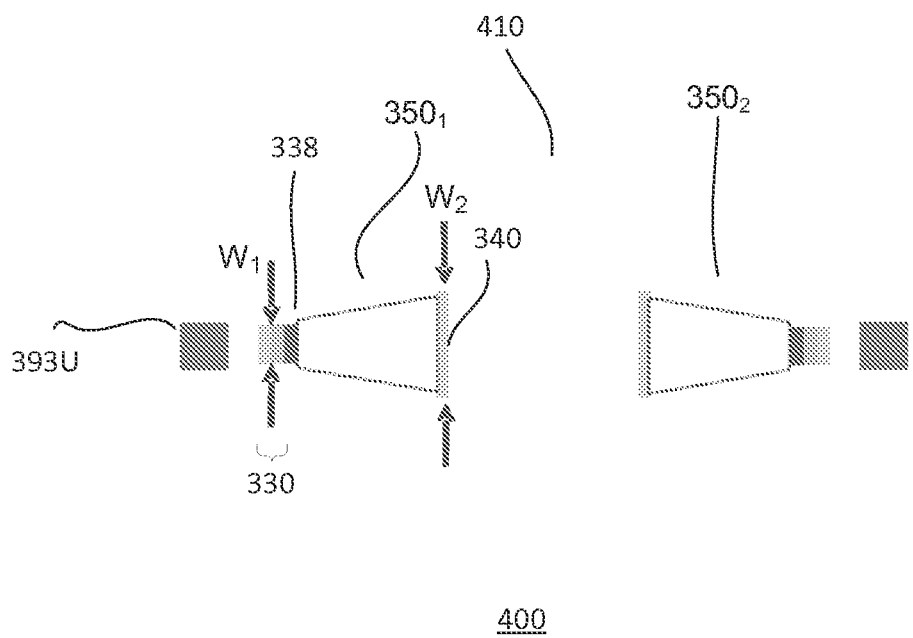

FIG. 4a shows a cross-sectional view of an embodiment of a device 400. FIGS. 4b-d show top views of various embodiments of the device. The cross-sectional view, for example, is along a first or wordline direction. A perpendicular direction to the first direction may be the bitline direction. The device includes a memory cell. In one embodiment, the memory cell is similar to the memory cell described in FIG. 1a, FIG. 2a and FIGS. 3a-d. Common elements may not be described or described in detail.

Referring to FIG. 4a, the memory cell is disposed on a substrate 305. The substrate, for example, is a semiconductor substrate, such as a silicon substrate. Other types of substrates may also be useful. The memory cell includes a storage unit 410 disposed in a cell dielectric layer 360. The cell dielectric layer is disposed between two interlevel dielectric (ILD) layers on the substrate. For example, the storage unit is disposed between upper and lower ILD layers 390U and 390L. The ILD layers may be formed of silicon oxide. Other types of dielectric materials may also be useful for the ILD layers. It is understood that the different ILD layers need not be formed of the same material or have the same configuration.

In one embodiment, the lower metal level 394L is the first metal level M1 and the upper metal level 394U is a second metal level M2 of the device. In such case, the lower contact level 392L is a pre-metal dielectric (PMD) or contact (CA) level and the upper contact level 392U is a first via level V1. Contacts at the PMD level may be tungsten contacts while contacts at the V1 level may be copper or copper alloy. Other types of conductive materials, such as aluminum, may also be useful. Other configurations of contacts at the contact levels may also be useful.

In general, the storage unit may be disposed between any two metal levels of the device. For example, the storage unit may be disposed between any two metal layers, such as M2 and M3. In such case, a contact and contact pad may be provided in CA and M1 to facilitate electrical connections to, for example, a cell selector. In some instances, the contact may be a direct contact which extends through CA and M1. Other contact configurations may also be useful. Disposing the storage unit between other metal levels may also be useful. Preferably, the storage unit is disposed between two adjacent metal layers. Disposing the storage unit between non-adjacent metal layers may also be useful. For example, the storage unit may be disposed between M1 and M3. Disposing the storage unit between other non-adjacent metal levels may also be useful. Contacts may be provided in an intermediate ILD level to facilitate connections between two non-adjacent metal layers (e.g., M1 and M3). The contact may be a direct contact or a contact at the via level (e.g., V1) and a metal pad at the metal level (e.g., M2). Other contact configurations may also be useful.

The storage unit is disposed within the cell dielectric layer located between the lower metal level and upper contact level. The cell dielectric layer may be formed of silicon oxide. Other types of dielectric materials may also be useful for the cell dielectric layer. The cell dielectric layer may be formed of different dielectric layers. The different dielectric layers may be formed of the same material. Providing the dielectric layers with different materials may also be useful. Other configurations of the cell dielectric layers may also be useful. The cell dielectric layer, for example, may be considered part of the upper ILD layer.

In one embodiment, a dielectric liner 361 is disposed between the cell dielectric layer and the lower ILD layer. The dielectric liner, for example, serves as an etch stop layer. In one embodiment, the dielectric liner is formed of a low k dielectric. For example, the dielectric liner may be nBLOK. Other types of dielectric materials for the dielectric liner may also be useful.

The storage unit includes first and second cell stacks $350_{1-2}$. A cell stack includes a programming stack 351 disposed between lower and upper stack dielectric layers 366 and 368. In one embodiment, the programming stack includes a heater layer 352. The heater layer has a thickness $T_p$. The thickness $T_p$ of the heater layer, in one embodiment, is less than the minimum lithographic dimension or critical CD. Other thicknesses for $T_p$ may also be useful.

The heater layer is disposed between lower and upper heat shield layers 354 and 356. In one embodiment, the heat shield layers are formed of a PCM. For example, the heat shield layers are PC layers. The PCM, in one embodiment, is a chalcogenide material. In one embodiment, the chalcogenide material is a GeSbTe alloy. In another embodiment, the chalcogenide material is $Ge_2Sb_2Te_5$ (GST). Other types of chalcogenide or PCMs may also be employed as well as other types of dielectric layers with low thermal conductivity. The thickness of the storage layers may be about 20-100 nm. Other thicknesses may also be useful.

The storage layers may include a capping or protective layer. The capping layer may be employed to reduce oxidation or poor interface viscosity between layers. The capping layer, for example, may be silicon nitride or silicon oxynitride. Other types of capping layers may also be useful.

The cell stack includes opposing first ends along the first direction. For example, the cell stack includes opposing first ends along the wordline direction. A storage liner 338 lines at least the sidewall of a cell stack at one of the opposing first ends. For example, the storage liner lines at least the sidewall of the first opposing first end of a cell stack. In one embodiment, the first opposing first end is not adjacent to the other cell stack of the storage unit. As shown, the storage liner lines the sidewall of a cell stack at the first opposing first end and lower ILD layer, forming an L-shaped storage liner. For example, the storage liner lines the sidewall of a cell stack at the first opposing first end and the dielectric liner above the lower ILD layer. In one embodiment, the width of the storage liner is less than a width of the first opposing first end. For example, a width of the storage liner may be about the lithographic CD while the width of the first opposing first end is greater than the lithographic CD. Providing other widths for the storage liner may also be useful. The thickness of the storage liner may about 5-10 nm or less. Other thicknesses may also be useful.

In one embodiment, the storage liner is formed of a PCM. For example, the storage layers are PC layers. The PCM, in one embodiment, is a chalcogenide material. In one embodiment, the chalcogenide material is a GeSbTe alloy. In another embodiment, the chalcogenide material is $Ge_2Sb_2Te_5$ (GST). Other types of chalcogenide or PCMs may also be employed. In some embodiments, the storage liner include heater or insulator islands. Providing heater or insulator islands is described in, for example, co-pending U.S. patent application Ser. No. 13/802,841, titled "Resistive Non-Volatile Memory", which is herein incorporated by reference for all purposes.

The storage liner may include a capping or protective layer. For example, a capping layer may be on a surface not in contact with ILD or cell stack. For example, the capping layer may be provided on the top surface of the storage liner. Providing it on the bottom surface of both surfaces of the storage liner may also be useful. The capping layer may be employed to reduce oxidation or poor interface viscosity between layers. The capping layer, for example, may be silicon nitride or silicon oxynitride. Other types of capping layers may also be useful. The thickness of the capping layer, for example, may be about 20 nm. Other thicknesses may also be useful.

In one embodiment, the sidewall of a cell stack may include a thin insulator layer. For example, the thin insulator layer is disposed between the cell stack and storage liner. The thin insulator layer may be a thin silicon oxide layer. Other types of insulators may also be useful. The thin insulator layer may serve as a high voltage breakdown layer for initializing the procedure for the memory cell. Breaking down the dielectric layer forms, for example, heater or insulator islands. Providing heater or insulator islands is described in, for example, co-pending U.S. patent application Ser. No. 13/802,841, titled "Resistive Non-Volatile Memory", which is herein incorporated by reference for all purposes.

A top electrode (TE) layer 330 is disposed on the storage liner. The TE layer, for example, is formed of an ECM. The ECM, for example, has good conductivity and good interface with the PCM. In one embodiment, the TE layer is formed of an ECM with bad thermal conductivity to serve as a heat shield. For example, the TE layer may be a TaN layer. Other types of ECMs may also be useful. The TE layer is coupled to a bitline BL. For example, the TE layer is coupled to the BL by a contact. The contact may extend from the upper contact level through the cell dielectric layer. The TE layer provides connection for the bitline to the storage unit. In the case where the TE layer is an ECM with low thermal conductivity, it also serves as a heat shield.

In some embodiments, the TE layer may be a TE stack having multiple layers. For example, the TE stack may include first and second TE layers 332 and 334. The first TE layer, in one embodiment, contacts the BL. The second TE layer is disposed below that first TE layer and contacts the storage liner. In one embodiment, the first TE layer is formed of an ECM with good conductivity and low thermal conductivity. For example, the first TE layer is formed of TaN, serving as a heat shield and providing connection for the BL to the storage unit. Other types of ECMs may also be useful. As for the second TE layer, it is formed of an ECM which provides good electrical conductivity and good interface with the PCM. For example, the second TE layer may be formed of TiN. Other types of ECMs may also be useful. Other configurations of the TE stack may also be useful. The TE and storage liner may be collectively referred to as TE storage stack.

In one embodiment, the TE of the first cell stack is coupled to a first bitline BL1 of the memory cell; the TE of the second cell stack is coupled to a second bitline BL2 of the memory cell. A bitline is coupled to the cell stack by, for example, a via contact 393U.

A bottom electrode (BE) layer 340 at least lines the sidewall of the cell stack at the other opposing first end. For example, the BE layer at least lines the sidewall of the cell stack at the second opposing first end. In one embodiment, the second opposing first end is adjacent to the other cell stack. In one embodiment, the BE layer lines the sidewall of the cell stack at a second opposing first end and lower ILD layer. The BE layer is a common BE layer of the first and second cell stacks. In one embodiment, the cell dielectric includes an opening exposing the drain pad. The BE layer may line the sides of the opening, including second opposing sides of the cell stacks, and bottom, contacting a drain pad 395L disposed in the lower metal level 394L. For example, the dielectric liner includes an opening to expose the drain pad, enabling the BE layer to electrically couple to it. The BE layer, for example, is formed of an ECM with good electrical conductivity and bad thermal conductivity, such as TaN. Other types of ECMs may also be useful. Preferably, the BE is formed of the same material as the TE (or the first TE) layer. Other configurations of the electrode liner may also be useful.

The cell stacks $350_{1-2}$ may have various shapes from the top view. For example, the cell stack may have a rectangular shape, as shown in FIG. 4b. Other shapes may also be useful. For example, the cell stack may have a polygonal or a trapezoidal shape, as shown in FIGS. 4c-d. For non-rectangular shaped cell stacks, the narrower portion is disposed adjacent to the TE side while the wider portion is disposed adjacent to the BE side. The TE storage stack may have a rectangular shape. Other shapes may also be useful. The TE storage stack may have a width W1 along the BL direction. The width W1, for example, may be equal to the lithographic CD. The width W1, for example, may depend on the technology node. For example, W1 may be about 40 nm for a 40 nm node. Other widths for W1 may also be useful. The width W1 is preferably as small as possible to minimize contact cross-section between the storage liner and the heater element. In some cases, if current is sufficiently small, W1 may be larger than lithographic CD. This reduces cost due to non-CD mask or reticle.

As described, the TE storage stack has a width W1. The width W1 may be equal to CD to minimize contact area with the heater element to improve heating efficiency. It is understood that the width W1 is only related to the portion which contacts the sidewall of the first opposing first end. It is understood that the width of the TE stack may have a wider width W1c for forming contacts to the BL at a contact portion of the TE stack. The width W1c may be sufficient to accommodate a contact. This improves electrical connectivity to the BL.

The width W2 of the BE, as shown, is wider than W1. For example, W2 is larger than the lithographic CD. As shown, W2 is wider than width of the cell stack. This is because BE serves as a connection to the drain pad. There is no need to minimize the cross-sectional contact area to the heater as in the case of the storage liner. Providing a larger surface area increases current capacity. This reduces current crowding. Other widths for W2 may also be useful. For example, W2 may be the same as the width of the cell stack. Providing W2 which is narrower than the cell stack may also be useful.

Furthermore, as discussed, the storage unit may operate in either SLC or MLC mode. In SLC, the resistive elements are in opposite resistances. As such, both resistive elements are programmed at the same time. The hot spots for the resistive elements, for example, are disposed at the sides of the cell stacks which are opposite those adjacent to each other. In other words, the hot spots are located as far away from each other as possible within the storage unit. This reduces or minimizes thermal cross-talk.

A cell selector is provided. The cell selector may be provided on the substrate. In one embodiment, the cell selector is a MOS transistor. The MOS transistor may be a planar transistor. Providing a fin-type MOS transistor may also be useful. Other types of cell selectors, such as BJT or diodes, may also be useful. The MOS transistor includes a gate and first and second S/D regions in the substrate adjacent to the gate. The S/D regions may include lightly doped (LD) regions. The first S/D region 175, for example, serves as a drain while the second S/D region serves as a source. In one embodiment, the source is a common source region for an adjacent transistor of an adjacent row. The gate may include dielectric sidewall spacers.

In one embodiment, the source is coupled to a SL. For example, the source is coupled to the SL via a contact. As for the drain, it is coupled to the BE layer. For example, a drain contact 393L at the via or contact level and a drain pad 395L at the metal level may be provided to couple the cell stacks to the drain. The drain, as shown, is commonly coupled to the first and second cell stacks. Other configurations of coupling the drain and cell stack may also be useful. In the case of a BJT, for example, NPN BJT, the collector is coupled to BE, the base is coupled to WL and the emitter is coupled to SL. In the case of a diode as a cell selector, the drain pad may be a wordline forming of a row of memory cell.

Isolation regions 380 are provided. In one embodiment, the isolation region is a shallow trench isolation (STI) region. Other types of isolation regions may also be useful. The isolation regions are provided to separate columns of memory cells in the bitline direction and adjacent drain regions of select transistors of memory cells in the wordline direction.

Memory cells, as described, can be arranged in rows and columns, forming an array. Rows may correspond to wordlines and columns may correspond to bitlines. Cell selectors of two adjacent rows may be configured to share a common source region while the drain regions are not common, forming a transistor pair. A plurality of transistor pairs is arranged in the row and column directions. The transistor pairs are separated from each other by isolation regions. Gate conductors are disposed on the substrate and traverse the transistor pairs in the row direction. The gate conductors, for example, are polysilicon gate conductors.

In the case where a large number of memory cells are provided in a row, strap cells may be provided. Strap cells, for example, are contacts which connect wordlines in a metal level to the gate. The use of strap cells to stitch connections between the wordlines and gate increases array performance. Strap cells, for example, may be provided at every 16 or 32 cells in the rows. Providing strap cells at other number of cells may also be useful.

In the case where strap cells are employed, it is preferable to avoid SLs and BLs in the same level. For example, WLs are provided in M1, SLs in M2 and BLs in M3, with storage units disposed between M2 and M3. Additional storage units may be stacked in metal levels above M3. Other configurations of WLs, SLs, BLs and storage units may also be useful. In the case of an array without strap cells, such as in the case of a small array, WLs are the gates, SLs are located in M1 and BLs are located in M2, with the storage units disposed between M1 and M2. Additional storage units may be stacked in metal levels above M2. Other configurations of WLs, SLs, BLs and storage units may also be useful.

As described, the storage elements R1 and R2 of the memory cell are located in the storage liner of the first and second cell stacks at about the interface with the heater layer. The cross-sectional area of the interface of the resistive elements and the heater can be designed to be small. For example, the cross-sectional area of the interface is equal to $W1 \times T_p$. Since $T_p$ is less than the minimum lithographic resolution and W1 can be equal to the minimum lithographic resolution, the cross-sectional area can be designed to be smaller than that of conventional devices, which is equal to minimum lithographic resolution×minimum lithographic resolution. Providing a small cross-sectional area for the interface increases heating efficiency, therefore reducing programming current necessary for programming R1 and R2. This reduces power consumption of the device. Additionally, this may reduce cell size since the transistor required for generating the programming current can be smaller. This results in reduced manufacturing cost.

A plurality of storage units may be coupled in parallel to a cell selector. For example, the cell selector can be used to select a plurality of storage units. Each storage unit (or sub-storage unit) is coupled to its respective BL. This enables a cell selector to select a plurality of storage units. The storage units may be stacked one above another. For example, storage units may be disposed between adjacent metal levels and interconnected to the drain pad by contacts and pads. Stacking of storage units, for example, are described in co-pending U.S. patent application Ser. No. 13/802,899, titled "Stackable Non-Volatile Memory", which is already herein incorporated by reference for all purposes.

FIGS. 5a-i show cross-sectional views of a process of forming an embodiment of a device 500. The process includes forming a memory cell. The memory cell, in one embodiment, is a resistive-type memory cell. For example, the memory cell is a PCRAM cell. The memory cell is similar to that described in FIGS. 1a, 2a, 3a-d and 4a-d. Common elements may not be described or described in detail. The cross-sectional views are along the wordline direction. Although the cross-sectional views show one memory cell, it is understood that the device includes a plurality of memory cells of, for example, a memory array.

Referring to FIG. 5a, a substrate 305 is provided. The substrate, for example, is a semiconductor substrate, such as a silicon substrate. Other types of semiconductor substrates, including silicon-germanium (SiGe), germanium (Ge), gallium-arsenic (GaAs) or any other suitable semiconductor materials as well as COI, may also be useful. The substrate may include a substrate component level. The substrate component level may include circuit components, such as transistors. Other circuit components may also useful.

In one embodiment, the substrate includes a cell selector for the memory cell. The cell selector may be a transistor. For example, the cell selector is a MOS transistor. Other types of cell selectors may also be useful. The transistor, in one embodiment, includes a gate, a first diffusion region 175 and a second diffusion region. The diffusion regions, for example, are source/drain (S/D) regions. The first diffusion region, for example, is a drain region and the second diffusion region is a source region. The gate is disposed on the substrate between the first and second S/D regions in the substrate. A channel of the transistor is disposed below the gate between the S/D regions. The gate may be a gate conductor which is a common gate for a row of memory cells in the wordline direction.

A lower ILD layer 390L is disposed over the substrate covering the cell selector. The lower ILD layer may include a lower contact level 392L and lower metal level 394L. In one embodiment, the lower contact level is the CA level and the lower metal level is the M1 level. Contacts are provided to the S/D regions in the contact level of the lower ILD layer. For example, a SL is disposed in the lower metal level of the lower ILD layer and coupled to the second S/D region by a source contact. As for the first S/D region, a drain contact 393L in the lower contact level couples it to a drain connector or pad 395L in the lower metal level.

Isolation regions 380 are prepared. In one embodiment, the isolation region is a shallow trench isolation (STI) region prepared in trenches formed in the substrate. Other types of isolation regions may also be useful. The isolation regions are provided to separate columns of memory cells in the bitline direction and adjacent drain regions of select transistors of memory cells in the wordline direction. A device well may be provided. The device well, for example, encompasses the transistor.

In one embodiment, the lower ILD layer is formed of silicon oxide. The lower ILD layer, for example, may be formed by Chemical Vapor Deposition (CVD). Other techniques may also be useful. A planarizing process may be performed. The planarizing process, for example, may include chemical mechanical polishing (CMP). Other types of planarizing process may also be useful.

Figure 5B:
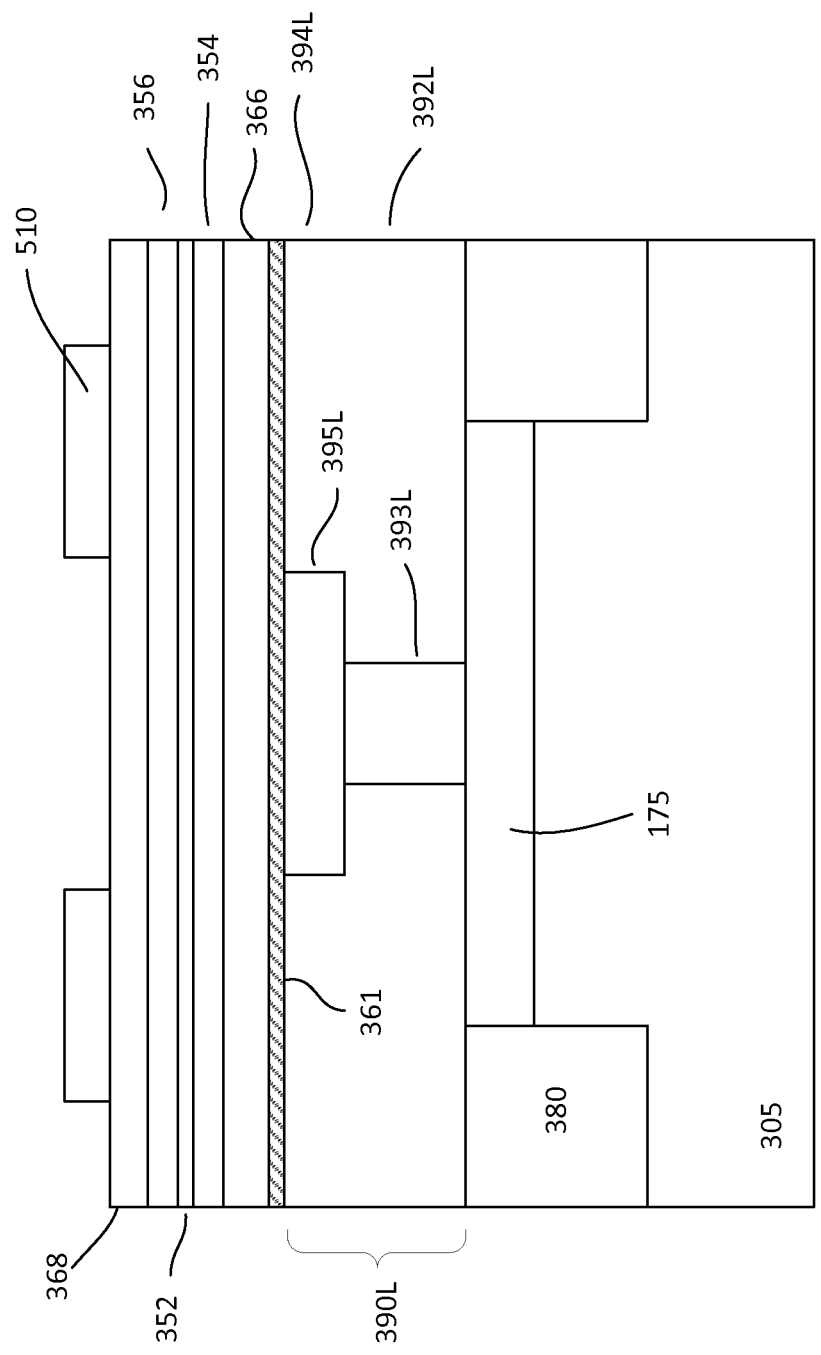

Referring to FIG. 5b, a dielectric liner 361 is formed over the lower ILD layer. The dielectric liner, for example, serves as an etch stop layer. In one embodiment, the dielectric liner is formed of a low k dielectric. For example, the dielectric liner may be an nBLOK layer. Other types of dielectric liner materials may also be useful. The dielectric liner, for example, may be formed by blanket deposition using CVD. Other techniques of forming the dielectric liner may also be useful.

In one embodiment, the various layers of a cell stack are formed on the substrate. For example, a lower stack dielectric layer 366, a lower heat shield layer 354, a heater layer 352, an upper heat shield layer 356, and an upper stack dielectric layer 368 are formed on the substrate. The layers of the cell stack may be formed over the dielectric liner.

The stack dielectric layers, for example, may be formed of silicon oxide. Other types of dielectric materials may also be useful for the stack dielectric layers. It is understood that the upper and lower stack dielectric layers need not be formed of the same material. The stack dielectric layers, for example, may be formed by CVD. Other techniques may also be useful.

As for the heat shield layers, in one embodiment, they are form of a PCM. For example, the heat shield layers are PCM layers. The heat shield layers, for example, may be formed of chalcogenide material. In one embodiment, the chalcogenide material is a germanium-antimony-tellurium (GeSbTe) alloy. In one embodiment, the chalcogenide material is $Ge_2Sb_2Te_5$ (GST). Other types of chalcogenide or PCMs may also be employed. Providing other types of heat shield layers may also be useful. The heat shield layers may be formed by physical vapor deposition (PVD). Forming the heat shield layers using other techniques, such as CVD, or a combination of techniques may also be useful.

The heat shield layers may include one or more capping or protective layers on its top and/or bottom surfaces. A protective layer reduces oxidation and/or provides good interface forming. A protective layer, for example, may be silicon nitride or oxynitride. Other types of protective layers may also be useful. The protective layer may be formed by CVD. Other techniques for forming the protective layer may also be useful.

Regarding the heater layer, it may be formed of an ECM. In one embodiment, the heater layer is formed of an ECM with good or suitable conductivity. For example, the heater layer may be a titanium nitride (TiN) layer. Other types of ECMs may also be useful. For example, the heater may be formed of W or TaN. The type of ECM may depend on, for example, the type of storage layer used. In one embodiment, the heater layer may be formed by CVD. Other techniques for forming the heater layer, such as PVD, are also useful.

A first mask layer 510 is formed on the substrate. The first mask layer, for example, is formed over the cell stack layers. In one embodiment, the mask layer is a soft mask layer, such as a photoresist layer. An exposure source may selectively expose the photoresist layer through a reticle containing the desired pattern. For example, a first reticle or mask is used. After selectively exposing the photoresist layer, it is developed to form openings corresponding to location where the cell stack layers are to be removed. To improve lithographic resolution, an anti-reflective coating (not shown) may be used below the photoresist layer. In other embodiments, the mask layer may be a hard mask layer. For example, the hard mask layer may be TEOS layer. Patterning the hard mask layer may be achieved using a soft mask layer, such as photoresist.

Figure 5C:
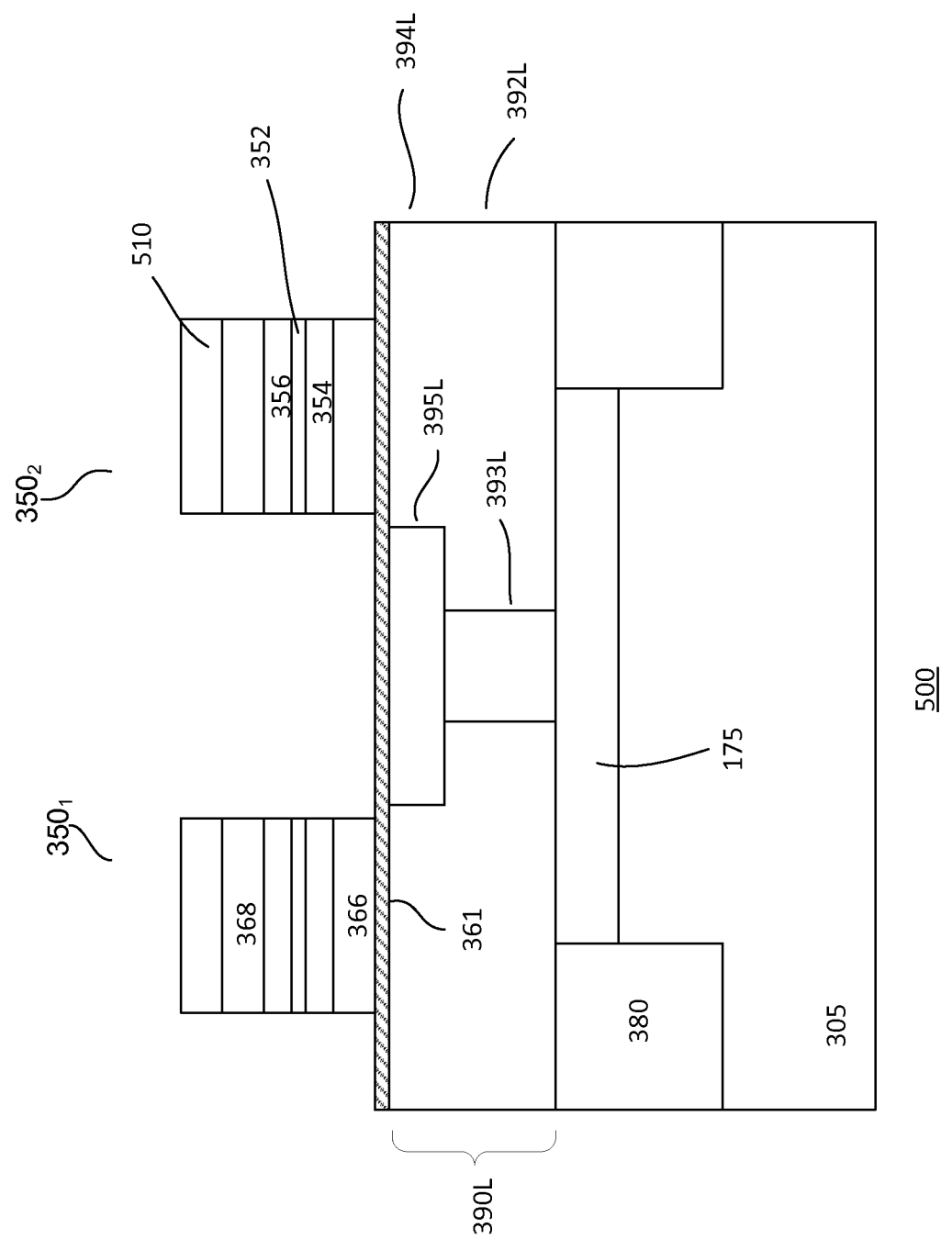

In FIG. 5c, the patterned mask layer is used to pattern the cell stack layers. In one embodiment, an anisotropic etch, such as reactive ion etch (RIE), is used to remove exposed portions of the cell stack layers. Other types of etch processes may also be useful. The etch transfers the pattern of the mask layer to the underlying cell stack layers. Patterning the cell stack layers forms first and second cell stacks $350_{1-2}$. The cell stack may have various shapes, such as those described in FIGS. 4b-d. For example, the cell stack may have a rectangular shape, polygonal shape or a trapezoidal shape. Other shapes may also be useful.

Figure 5D:
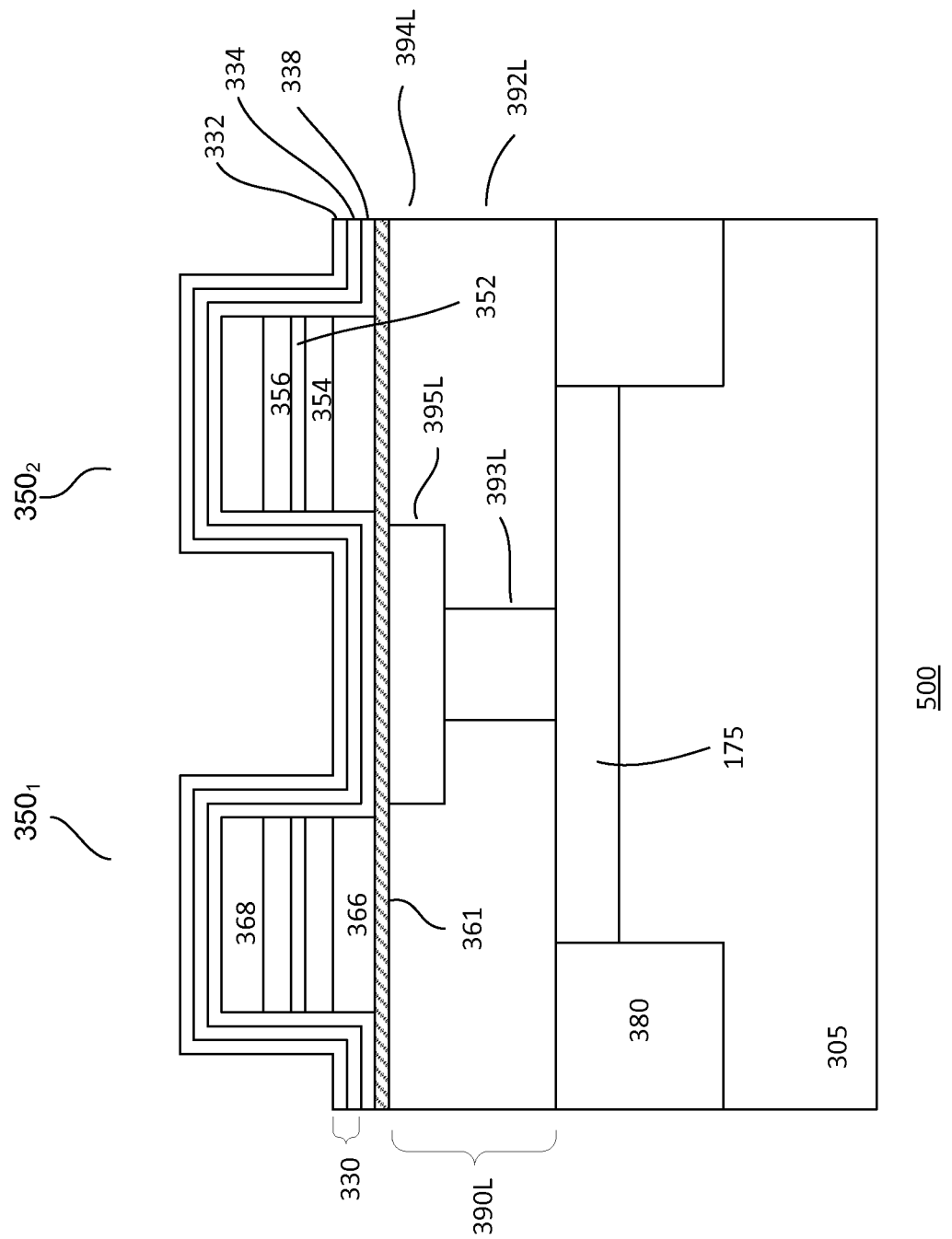

After the patterning of the cell stack layers, the mask layer is removed, as shown in FIG. 5d. In one embodiment, the mask layer is removed by ashing. Other techniques of removing the mask layer may also be useful. For example, in the case of a hard mask, a wet etch may be employed to remove the mask.

The process continues to form a storage liner 338. The storage liner, for example, is a PCM liner. The storage liner may be formed of a chalcogenide material. In one embodiment, the chalcogenide material is a germanium-antimony-tellurium (GeSbTe) alloy. In another embodiment, the chalcogenide material is $Ge_2Sb_2Te_5$ (GST). Other types of chalcogenide or PCMs may also be employed. The storage liner may be formed by physical vapor deposition (PVD). Forming the storage liner using other techniques, such as CVD, or a combination of techniques may also be useful.

The storage liner may include a capping or protective layer. The capping layer may be disposed on the storage liner after deposition. The protective layer reduces oxidation and/or provides good interface forming. The protective layer, for example, may be silicon nitride or oxynitride. Other types of protective layers may also be useful. The protective layer may be formed by CVD. Other techniques for forming the protective layer may also be useful.

In some embodiments, a thin insulator layer may be formed prior to forming the storage liner. The thin insulator layer, for example, may be silicon oxide. Other types of insulating or dielectric materials may also be useful. The insulator may be formed by, for example, CVD. Other techniques for forming the insulator layer may also be useful. The thin insulator layer is subsequently subjected to an initialization process to electrically break it down to form, for example, heater islands. For example, the insulator layer may be subjected to a high breakdown voltage. The insulator layer may be less than about 10 nm thick. For example, the insulator layer may be about 1-5 nm thick. Other thicknesses may also be useful.

A top electrode (TE) layer 330 is disposed on the storage liner. The TE layer, for example, is formed of an ECM. In one embodiment, the TE layer is an ECM with poor thermal conductivity. For example, the TE layer is a TaN layer. Other types of ECMs may also be useful. The TE layer may be formed by, for example, PVD. Other techniques, such as CVD, may also be useful.

In some embodiments, the TE layer may be a TE stack having multiple layers. For example, the TE stack may include first and second TE layers 332 and 334. The first TE layer is formed over the second TE layer while the second TE layer is formed over the storage liner. The first TE layer, in one embodiment, is formed of an ECM with low thermal conductivity. For example, the first TE layer is formed of TaN, serving as a heat shield. Other types of ECMs may also be useful. The second TE layer, for example, may be an ECM. For example, the second TE layer may be TiN. Other types of ECMs may also be useful. The second TE layer may facilitate good interface forming with the PCM. The TE layers may be formed by, for example, PVD. Other techniques, such as CVD, may also be useful.

A second mask layer (not shown) is formed on the substrate. The second mask layer, for example, is formed over the TE layer. In one embodiment, the mask layer is a soft mask layer, such as a photoresist layer. Other types of mask layers may also be useful. An exposure source may selectively expose the photoresist layer through a reticle containing the desired pattern. For example, a reticle or mask is used. After selectively exposing the photoresist layer, it is developed to form openings. The openings, for example, correspond to where the TE layer and storage liner are to be removed. To improve lithographic resolution, an anti-reflective coating (not shown) may be used below the photoresist layer. In other embodiments, the mask layer may be a hard mask layer.

Figure 5E:
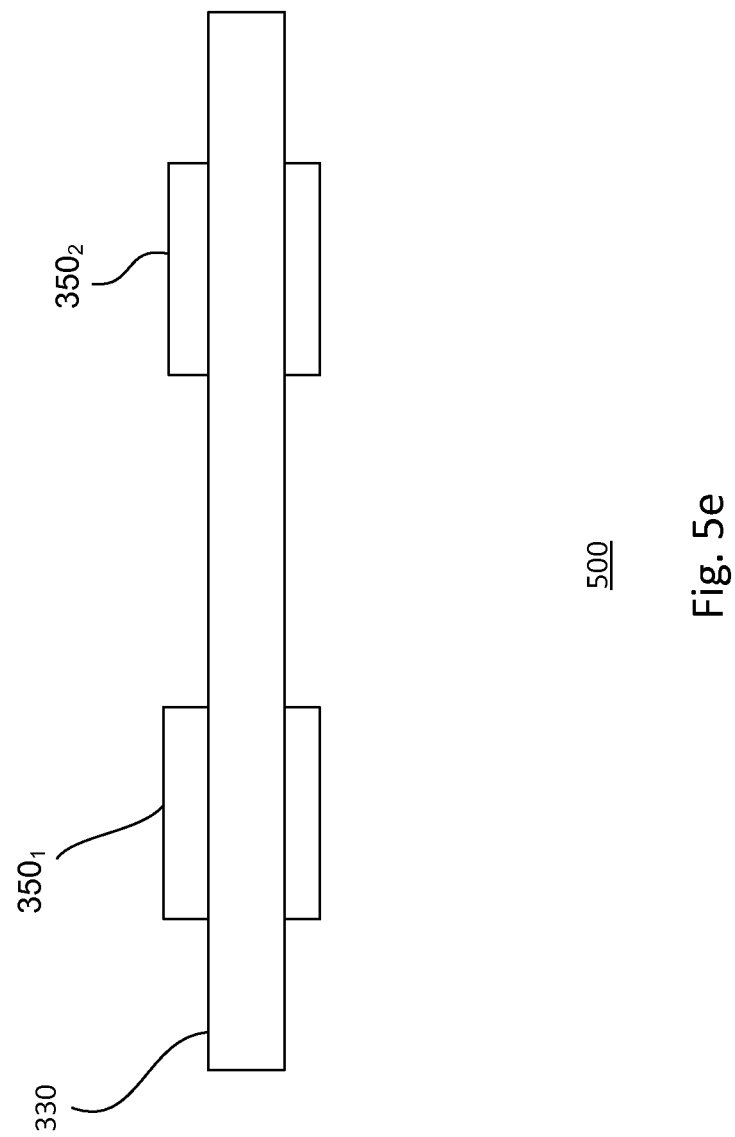

The patterned mask layer is used to pattern the TE layer and storage liner. In one embodiment, an anisotropic etch, such RIE, is used to remove exposed portions of the TE layer and storage liner. Other types of etch processes may also be useful. The etch transfers the pattern of the mask layer to the underlying TE layer and storage liner. The TE layer and storage liner may have a rectangular shape with a width W1 which is narrower than the cell stacks, as shown by FIG. 5e, which is a corresponding top view of FIG. 5d. For example, the TE layer and storage liner have a width W1 which is equal to about the lithographic resolution. Other widths for W1 may also be useful. Patterning of the TE layer and storage liner exposes portions of the dielectric liner and top of the cell stacks.

Figure 5F:
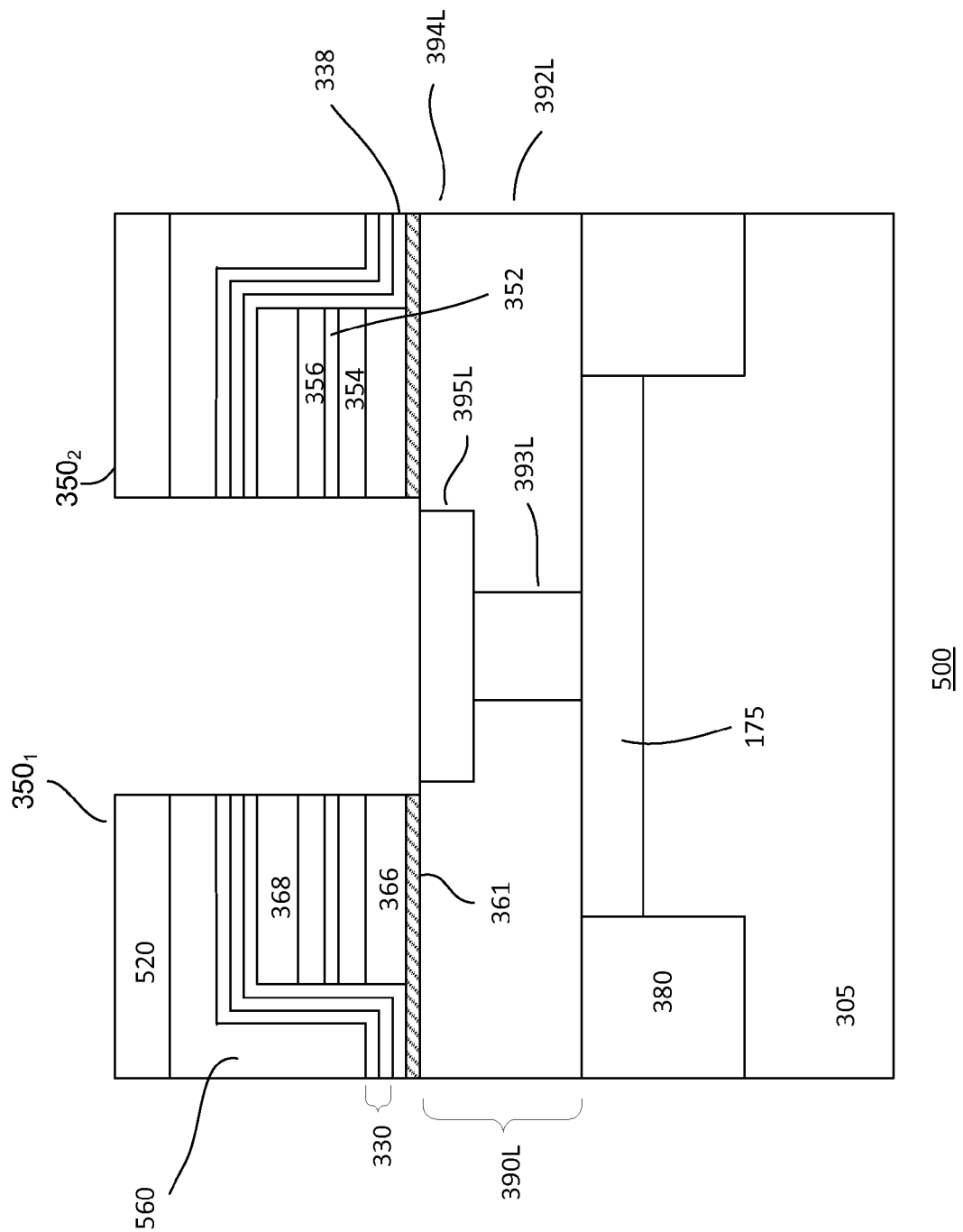

As shown in FIG. 5f, a dielectric layer 560 is formed on the substrate. The dielectric layer covers the cell stacks, dielectric liner and TE. The dielectric layer is used to form, for example, a part of the cell dielectric layer. The dielectric layer, for example is silicon oxide. Other types of dielectric materials may also be useful. In one embodiment, the dielectric layer may be the same as the stack dielectric layers. The dielectric layer, for example, may be formed by CVD. Other techniques for forming the dielectric layer may also be useful. A planarization process, such as CMP, may be performed to provide a planar surface. The planar top surface of the dielectric is above the top of the cell stacks.

The dielectric layer is patterned to expose the connection to the cell selector. For example, the drain pad 395L coupled to the drain of the cell selector is exposed. Patterning the dielectric layer, for example, is facilitated by a mask 520. For example, the mask is a third mask, such as a photoresist mask. An ARC layer may be provided below the photoresist to improve lithographic resolution. An anisotropic etch, such as RIE, may be employed, removing the exposed dielectric layer and liner to expose the drain pad.

After the patterning of the dielectric layer, the mask layer is removed. In one embodiment, the mask layer is removed by ashing. Other techniques of removing the mask layer may also be useful.

Figure 5G:
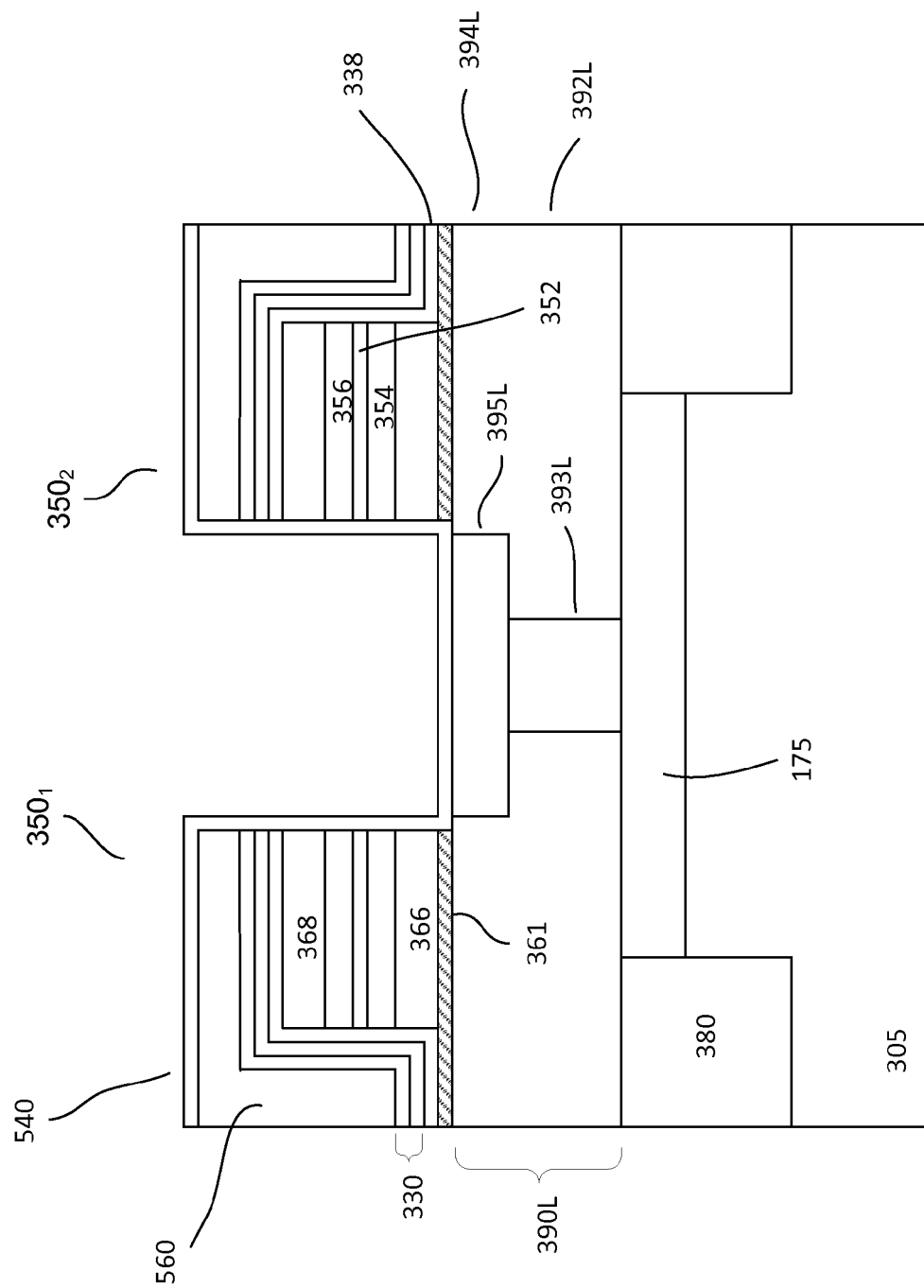

Referring to FIG. 5g, a BE layer 540 is formed on the dielectric layer, lining it and the opening between the cell stacks. The BE layer also contacts the drain pad between the cell stacks. The BE layer, for example, is formed of an ECM. In one embodiment, the BE layer is formed of an ECM with low thermal conductivity, such as TaN. Other types of ECMs may also be useful. The BE layer serves as a connection to the heater layer and cell selector, as well as a heat shield. The BE layer may be formed by, for example, PVD. Other techniques, such as CVD, may also be useful.

Figure 5H:
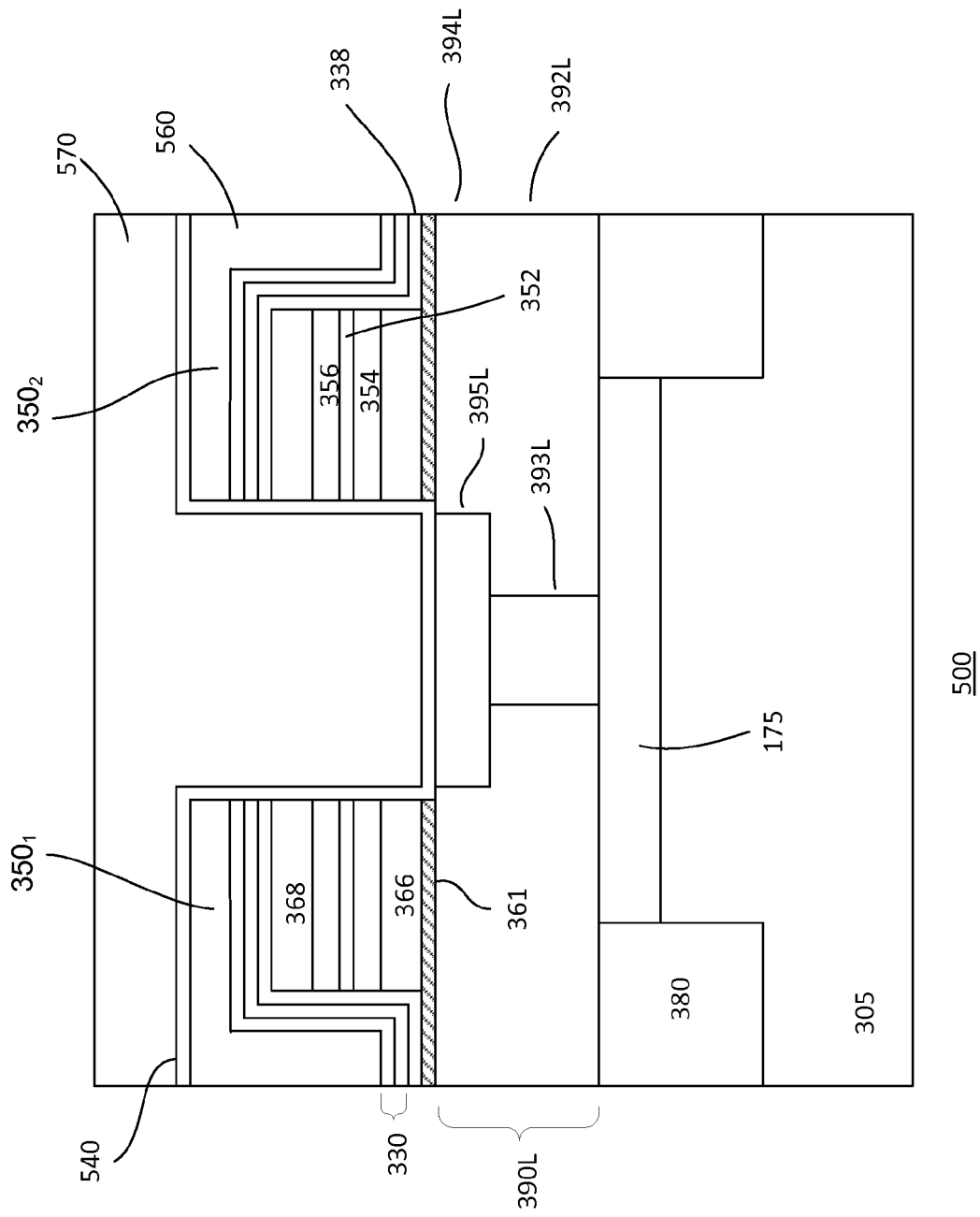

A dielectric layer 570 is formed on the substrate, as shown in FIG. 5h. The dielectric layer covers the BE layer and fills spaces between the cell stacks. The dielectric layer is used to form, for example, a part of the cell dielectric layer. The dielectric layer, for example is silicon oxide. Other types of dielectric materials may also be useful. In one embodiment, the dielectric layer may be the same as the stack dielectric layers. The dielectric layer, for example, may be formed by CVD. Other techniques for forming the dielectric layer may also be useful.

Figure 5I:
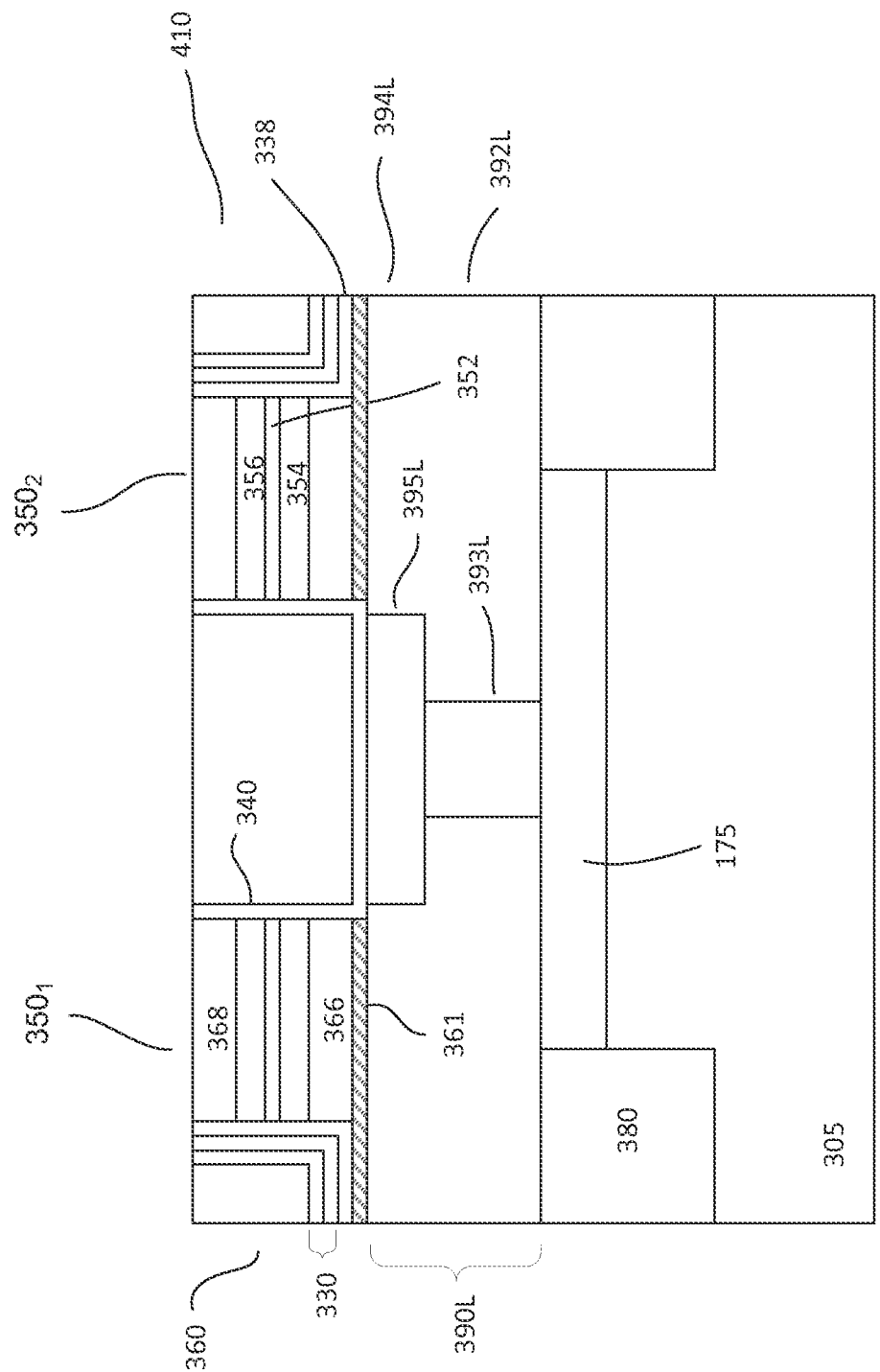

In FIG. 5i, excess dielectric material may be removed by a planarizing process. The planarizing process, for example, may be CMP. Other types of planarizing process may also be useful. Additionally, excess BE, TE and storage liner materials over the cell stacks are removed. The planarizing forms a planar surface over the substrate. For example, the top surfaces of the dielectric layer, cell stacks, BE, TE and storage liner are co-planar. As such, the planarization process forms a storage unit 410 with first and second cell stacks 350₁₋₂, TE, storage liner and BE. The storage unit is disposed in the cell dielectric layer 360. The storage unit, for example, is similar to that described in FIG. 4a.

Figure 5J:
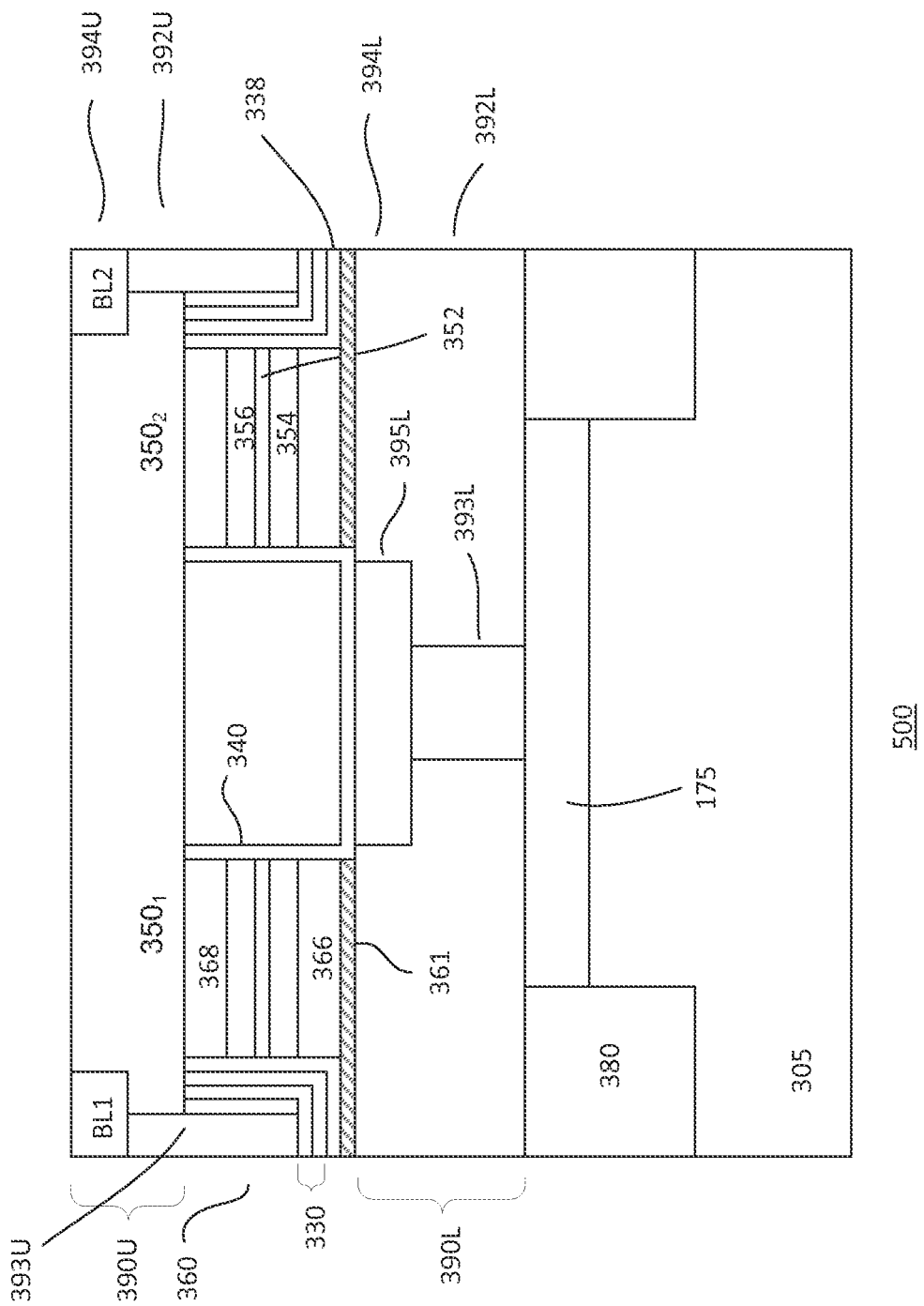

Referring to FIG. 5j, the process continues to form BL1 and BL2 coupled to the storage unit. In one embodiment an upper dielectric layer ILD layer 390U is formed over the cell dielectric layer. The upper ILD layer may be silicon oxide. Other types of dielectric layers may also be useful. Various techniques may be used to form the upper ILD layer. For example, the upper ILD layer may be formed by CVD. First and second bitlines BL1 and BL2 are formed in a metal level 394U of the upper ILD layer. BL1 and BL2 are coupled to TE of the first and cell stacks by, for example, first and second bitline contacts 393U in an upper via level 392U. The bitlines and contacts may be formed of copper or copper alloy. Other types of conductive materials may also be useful. The bitlines and contacts may be formed by dual damascene techniques. Other techniques for forming the bitlines and contacts may also be useful.

The process continues to complete forming the device. The process may include, for example, forming additional metal levels, final passivation, dicing, packaging and testing. Other processes may also be included.

As described, the process forms a storage unit with first and second cell stacks. The process can be easily adopted to form a storage unit with a single cell stack. For example, the patterning of the cell stack layers can be modified to form a single cell stack instead of first and second cell stacks. Although the process, as shown, includes one memory cell, it is understood that the process may be applied to form a plurality of memory cells interconnected by wordlines and bitlines of a memory array.

A plurality of storage units may be coupled in parallel to a cell selector. For example, the cell selector can be used to select a plurality of storage units. Each storage unit (or sub-storage unit) is coupled to its respective BL. This enables a cell selector to select a plurality of storage units. The storage units may be stacked one above another. For example, storage units may be disposed between adjacent metal levels and interconnected to the drain pad by contacts and pads. Stacking of storage units, for example, are described in co-pending U.S. patent application Ser. No. 13/802,899, titled "Stackable Non-Volatile Memory", which is already herein incorporated by reference for all purposes.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a memory cell comprising:
   providing a substrate;
   forming a lower interlevel dielectric (ILD) layer having top and bottom surfaces over the substrate; and
   forming a storage unit in a cell dielectric layer above the top surface of the lower ILD layer comprising
      forming at least one cell stack having first and second opposing ends along a wordline direction,
      forming a storage layer on the first end of the cell stack, wherein the storage layer lines a sidewall of the first end of the cell stack and the top surface of the lower ILD layer to form a L-shaped storage layer,
      forming a top electrode on the first end of the cell stack, wherein the top electrode is formed over the storage layer, and
      forming a bottom electrode on the second end of the cell stack, wherein the bottom electrode lines a sidewall of the second end of the cell stack and the top surface of the lower ILD layer.

2. The method of claim 1 wherein the cell stack comprises:
   upper and lower stack dielectric layers; and
   a heater stack disposed between the upper and lower stack dielectric layers.

3. The method of claim 2 wherein the heater stack comprises a heater layer comprising an electrical connection material (ECM) disposed between upper and lower heat shield layers comprising phase change material (PCM) or low thermal conductivity (LTC) material.

4. The method of claim 3 wherein the ECM comprises TiN and the PCM comprises a chalcogenide material.

5. The method of claim 1 wherein the cell dielectric layer is disposed between first and second metal levels of the memory cell, wherein the first metal level is below the second metal level.

6. The method of claim 1 comprises forming a cell selector, wherein the cell selector is coupled to the storage unit.

7. The method of claim 6 wherein:
   the cell selector comprises a MOS transistor having a gate, source and drain terminals; and
   the drain terminal is coupled to and contacts portion of the bottom electrode which lines the top surface of the ILD layer.

8. The method of claim 7 wherein the transistor is disposed on the substrate below the storage unit.

9. The method of claim 1 further comprises forming a breakdown dielectric layer on the first end of the cell stack between the cell stack and the storage layer.

10. The method of claim 9 wherein the breakdown dielectric layer is subjected to a breakdown voltage to form heater islands.

11. The method of claim 5 wherein forming the storage unit comprises:
    forming the storage layer over the cell stack disposed on a dielectric liner lining the first metal level, wherein the storage layer lines the dielectric liner and the cell stack;
    forming a top electrode layer over the storage layer;
    patterning the top electrode layer and the storage layer;
    forming a first dielectric layer over the patterned top electrode and storage layers,
    patterning the first dielectric layer to form a contact opening which exposes a contact region disposed in the first metal level adjacent to the second end of the cell stack;
    forming a bottom electrode layer over the substrate, the bottom electrode layer lining the first dielectric layer and contact opening; and
    forming a second dielectric layer over the substrate, the second dielectric layer covering the bottom electrode layer and filling the contact opening.

12. The method of claim 11 wherein forming the top electrode layer comprises:
    forming a first top electrode layer lining the storage layer, the first electrode layer comprises a LTC layer; and
    forming a second top electrode layer lining the first top electrode layer, the second top electrode layer comprises an ECM layer.

13. The method of claim 11 further comprises planarizing the substrate, wherein planarizing removes excess first and second dielectric material, top and bottom electrode layer and storage layer to expose a top of the cell stack with the top electrode over the storage layer at the first end of the cell stack and the bottom electrode at the second end of the cell stack.

14. The method of claim 12 further comprises:
forming a third dielectric layer over the cell stack and the first and second dielectric layers, wherein the first and second dielectric layers serve as the cell dielectric layer and third dielectric layer serves as an upper ILD layer; and
forming a bitline contact coupled to the top electrode.

15. The method of claim 1 wherein the memory cell comprises first and second storage units, wherein second ends of the storage units are adjacent to each other.

16. A memory cell comprising:
a substrate;
a lower interlevel dielectric (ILD) layer having top and bottom surfaces disposed over the substrate;
a storage unit disposed in a cell dielectric layer above the top surface of the lower ILD layer, wherein the storage unit comprises
at least one cell stack having a first and second opposing ends along a wordline direction,
a storage layer disposed on the first end of the cell stack, wherein the storage layer lines a sidewall of the first end of the cell stack and the top surface of the lower ILD layer to form a L-shaped storage layer,
a top electrode on the first end of the cell stack, wherein the top electrode layer is disposed over the storage layer, and
a bottom electrode on the second end of the cell stack, wherein the bottom electrode lines a sidewall of the second end of the cell stack and the top surface of the lower ILD layer.

17. The memory cell of claim 16 wherein the storage layer and the top electrode comprise a width W1 which is smaller than a width of the cell stack along a bitline direction, while the bottom electrode comprises a width W2 which is the same or larger than the width of the cell stack along the bitline direction.

18. The memory cell of claim 16 wherein the top electrode comprises:
a first top electrode disposed over the storage layer, the first top electrode layer comprises a LTC material; and
a second top electrode disposed over the first top electrode, the second top electrode comprises an ECM.

19. The memory cell of claim 16 comprises first and second storage units, wherein second ends of the storage units are adjacent to each other.

20. A method of forming a memory cell comprising:
providing a substrate;
forming a lower dielectric (ILD) layer having top and bottom surfaces over the substrate; and
forming a storage unit in a cell dielectric layer above the top surface of the lower ILD layer comprising
forming first and second cell stacks having first and second opposing ends along a wordline direction, wherein the second ends of the cell stacks are adjacent to each other,
forming a storage layer on the first ends of the cell stacks, wherein the storage layer lines sidewall of the first ends of the cell stacks and the top surface of the lower ILD layer to form a L-shaped storage layer,
forming a top electrode on the first ends of the cell stacks, wherein the top electrode is formed over the storage layer, and
forming a bottom electrode on the second ends of the cell stacks, wherein the bottom electrode lines sidewalls of the second ends of the cell stacks and the top surface of the lower ILD layer.

* * * * *